United States Patent
Umemoto et al.

(10) Patent No.: US 10,147,809 B2
(45) Date of Patent: *Dec. 4, 2018

(54) SEMICONDUCTOR DEVICE

(71) Applicant: MURATA MANUFACTURING CO., LTD., Kyoto-fu (JP)

(72) Inventors: Yasunari Umemoto, Nagaokakyo (JP); Atsushi Kurokawa, Nagaokakyo (JP); Tsunekazu Saimei, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/988,016

(22) Filed: Jan. 5, 2016

(65) Prior Publication Data
US 2016/0133732 A1 May 12, 2016

Related U.S. Application Data

(63) Continuation of application No. PCT/JP2014/065080, filed on Jun. 6, 2014.

(30) Foreign Application Priority Data

Jul. 10, 2013 (JP) ................................. 2013-144454

(51) Int. Cl.
*H01L 29/737* (2006.01)
*H01L 29/36* (2006.01)
(Continued)

(52) U.S. Cl.
CPC ...... *H01L 29/7371* (2013.01); *H01L 29/0817* (2013.01); *H01L 29/0821* (2013.01);
(Continued)

(58) Field of Classification Search
CPC ............ H01L 29/0817; H01L 29/0821; H01L 29/1004; H01L 29/205; H01L 29/36;
(Continued)

(56) References Cited

U.S. PATENT DOCUMENTS 6,049,099 A * 4/2000 Vaccaro ................. H01L 29/267
257/200
6,563,145 B1 * 5/2003 Chang ................. H01L 29/0821
257/197
(Continued)

FOREIGN PATENT DOCUMENTS

JP H02-291135 A 11/1990
JP 2002-076012 * 3/2002 ........... H01L 21/331
(Continued)

OTHER PUBLICATIONS

International Search Report—PCT/JP2014/065080 dated Sep. 16, 2014.
(Continued)

Primary Examiner — Khiem D Nguyen
(74) Attorney, Agent, or Firm — Studebaker & Brackett PC

(57) ABSTRACT

In a bipolar transistor, a collector layer includes three semiconductor layers: an n-type GaAs layer (Si concentration: about $5\times10^{15}$ cm$^{-3}$, thickness: about 350 nm), a p-type GaAs layer (C concentration: about $4.5\times10^{15}$ cm$^{-3}$, thickness: about 100 nm, sheet concentration: $4.5\times10^{10}$ cm$^{-2}$), and an n-type GaAs layer Si concentration: about $5\times10^{15}$ cm$^{-3}$, thickness: about 500 nm. The sheet concentration of the p-type GaAs layer is set to less than $1\times10^{11}$ cm$^{-2}$.

20 Claims, 20 Drawing Sheets

(51) Int. Cl.
  *H01L 29/66* (2006.01)
  *H01L 29/08* (2006.01)
  *H01L 29/10* (2006.01)
  *H01L 29/205* (2006.01)
  *H01L 29/12* (2006.01)

(52) U.S. Cl.
  CPC ........ *H01L 29/1004* (2013.01); *H01L 29/122* (2013.01); *H01L 29/205* (2013.01); *H01L 29/36* (2013.01); *H01L 29/6631* (2013.01); *H01L 29/66242* (2013.01)

(58) Field of Classification Search
  CPC ............... H01L 29/6631; H01L 29/732; H01L 29/7371; H01L 2924/1305; H01L 29/66318; H01L 29/66242
  See application file for complete search history.

(56) References Cited

U.S. PATENT DOCUMENTS

| | | | | |
|---|---|---|---|---|
| 6,661,037 | B2* | 12/2003 | Pan | H01L 29/0817 257/187 |
| 9,331,187 | B2* | 5/2016 | Umemoto | H01L 29/7371 |
| 2005/0001233 | A1* | 1/2005 | Sugiyama | H01L 29/0817 257/183 |
| 2005/0104088 | A1* | 5/2005 | Niwa | H01L 29/0821 257/197 |
| 2007/0023783 | A1* | 2/2007 | Hase | H01L 29/0817 257/197 |
| 2008/0116489 | A1* | 5/2008 | Niwa | H01L 29/7371 257/198 |
| 2010/0314665 | A1* | 12/2010 | Nogome | H01L 29/0821 257/197 |
| 2013/0285120 | A1* | 10/2013 | Zampardi, Jr. | H01L 29/36 257/197 |

FOREIGN PATENT DOCUMENTS

| | | |
|---|---|---|
| JP | 2002-076012 A | 3/2002 |
| JP | 2009-231593 A | 10/2009 |

OTHER PUBLICATIONS

Written Opinion—PCT/JP2014/065080 dated Sep. 16, 2014.
Tu et al., "Performance of High-Reliability and High-Linearity InGaP/GaAs HBT PAs for Wireless Communication", IEEE Transactions on Electron Devices, Jan. 2010, vol. 57, No. 1, pp. 188-194.
Ishibashi, "Nonequilibrium Electron Transport in HBTs", IEEE Transactions on Electron Devices, Nov. 2001, vol. 48, No. 11, pp. 2595-2605.

* cited by examiner

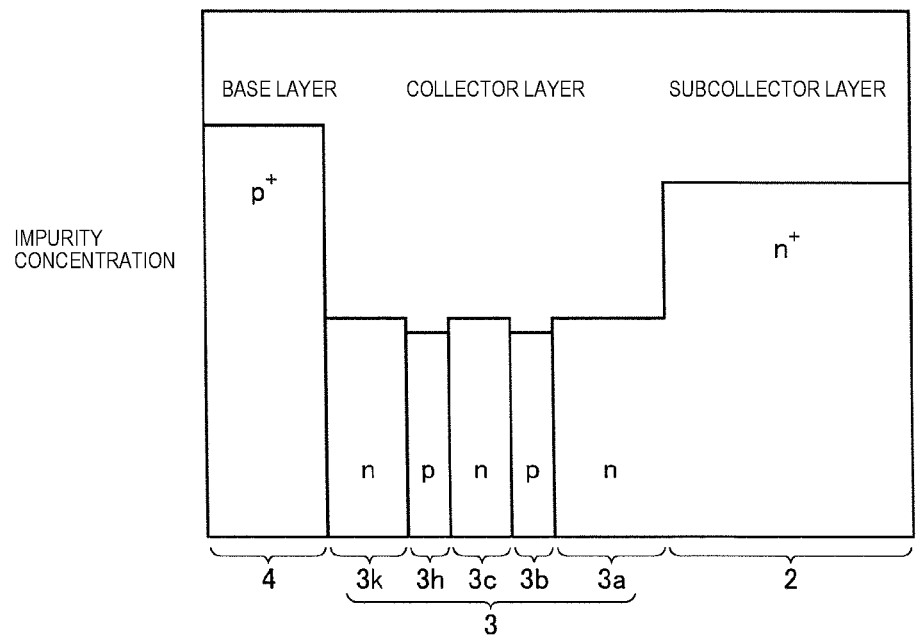
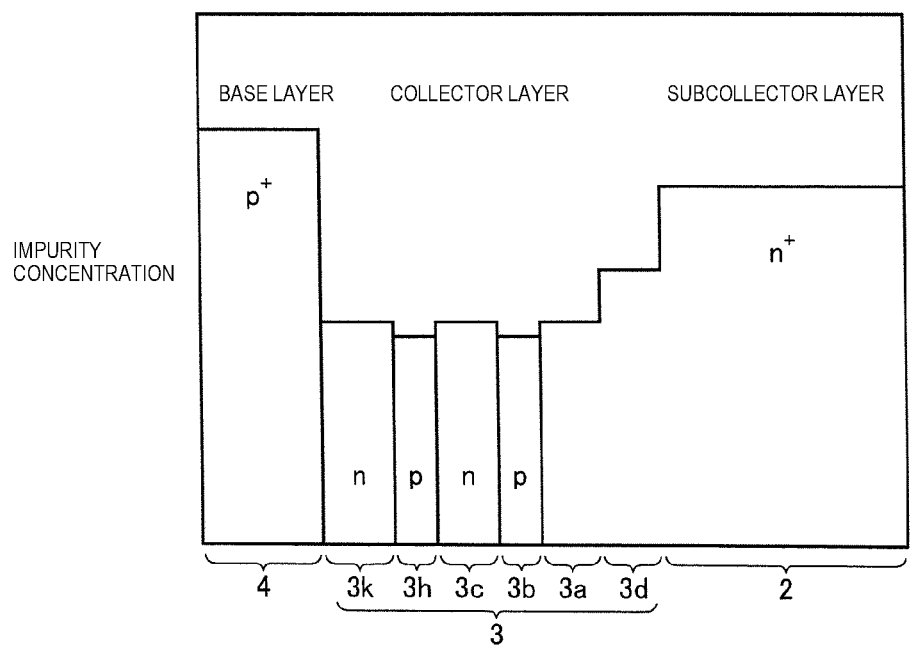

SEMICONDUCTOR DEVICE

CROSS REFERENCE TO RELATED APPLICATIONS

This application claims benefit of priority to Japanese Patent Application 2013-144454 filed Jul. 10, 2013, and to International Patent Application No. PCT/JP2014/065080 filed Jun. 6, 2014, the entire content of which is incorporated herein by reference.

TECHNICAL FIELD

The present disclosure relates to semiconductor devices, and more particularly to a semiconductor device including a bipolar transistor.

BACKGROUND

Heterojunction bipolar transistors have recently been used as transistors for power amplifier modules in mobile terminal devices and other devices. This type of bipolar transistor is called an HBT (Hetero Junction Bipolar Transistor).

A bipolar transistor disclosed in Min-Chang Tu, Herng-Yih Ueng, and Yu-Chi Wang: "Performance of High-Reliability and High-Linearity InGaP/GaAs HBT PAs for Wireless Communication" IEEE TRANSACTIONS ON ELECTRON DEVICES, VOL. 57, NO. 1, January (2010) p 188 is described as a first example of the prior art of such a bipolar transistor. As shown in FIG. 30, in the bipolar transistor, a subcollector layer 102 is formed in contact with a semiconductor substrate 101, such as that formed of GaAs, and a collector layer 103 is formed in contact with the subcollector layer 102. A base layer 104 is formed in contact with the collector layer 103, and an emitter layer 105 is formed in contact with the base layer 104. An emitter electrode 111 is formed in contact with the emitter layer 105. A base electrode 110 is formed in contact with the base layer 104. A collector electrode 109 is formed in contact with the subcollector layer 102.

In the bipolar transistor according to the first example of the prior art, the emitter layer 105 and the base layer 104 form a heterojunction. The emitter layer 105 is designed to have a wider band gap than the base layer 104. Furthermore, the collector layer 103 is formed to have a uniform impurity concentration in the thickness direction (depth direction).

Next, a bipolar transistor disclosed in Japanese Unexamined Patent Application Publication No. 02-291135 is described as a second example of the prior art of a bipolar transistor. As shown in FIG. 31, in the bipolar transistor according to the second example of the prior art, particularly the collector layer 103 includes a first collector layer 103a, a second collector layer 103b, and a third collector layer 103c. The first collector layer 103a having a relatively low impurity concentration and the second collector layer 103b having a relatively high impurity concentration form a junction. Since the other components are the same as in the bipolar transistor according to the first example of the prior art, the same components are denoted by the same reference numerals and description thereof is not repeated.

SUMMARY

Technical Problem

Heterojunction bipolar transistors require changes in capacitance between a base and a collector (base-to-collector capacitance) to be small relative to variations (changes) in voltage between a base and a collector in order to reduce modulation distortion and reduce variations in collector voltage for power gain (gain). That is, the base-to-collector capacitance is desirably constant (with linearity) in the range of practical voltages between a base and a collector.

FIG. 32 shows the results (graph) indicating the relationship between the base-to-collector capacitance and the base-to-collector voltage calculated by simulation. This graph shows the results of calculation obtained by varying collector concentration parameters within the scope of the documents. As shown in FIG. 32, the base-to-collector capacitance Cbc in the first example of the prior art and the second example of the prior art changes by a factor of about 1.5 to 2.0 in a base-to-collector voltage range (Vbc=about −4 to 0 V) considered as the range of general use. Furthermore, the graph indicating the base-to-collector capacitance Cbc rises steeply in a region where the base-to-collector voltage Vbc is positive, and the base-to-collector capacitance Cbc changes by a factor of about 2.0 to 2.5 in a base-to-collector voltage range inclusive of the positive region (Vbc=about −4 to 0.4), which deteriorates linearity.

Bipolar transistors used for power amplifier modules may operate at a relatively high voltage and may operate at a relatively low voltage. According to the structures in the first example of the prior art and the second example of the prior art, the base-to-collector capacitance varies relative to a practical base-to-collector voltage range (change), which disadvantageously increases modulation distortion and causes power gain to vary largely with the collector voltage.

The present disclosure has been made to solve the above-mentioned problems. It is an object of the present disclosure to provide a semiconductor device that reduces variations in base-to-collector capacitance.

Solution to Problem

A semiconductor device according to the present disclosure includes a collector layer, a base layer, and an emitter layer. The base layer is formed on the collector layer. The emitter layer is formed on the base layer. The collector layer includes first-conductivity-type semiconductor layers and at least one second-conductivity-type semiconductor layer. The total sheet concentration of the second-conductivity-type semiconductor layer is set to less than $1 \times 10^{11}$ cm$^{-2}$.

In the semiconductor device according to the present disclosure, the collector layer includes first-conductivity-type semiconductor layers and at least one second-conductivity-type semiconductor layer. The total sheet concentration of the second-conductivity-type semiconductor layer is set to less than $1 \times 10^{11}$ cm$^{-2}$. This configuration can reduce variations (changes) in base-to-collector capacitance and can reduce modulation distortion while reducing variations in collector voltage for power gain.

The second-conductivity-type semiconductor layer is preferably sandwiched between the first-conductivity-type semiconductor layers. The second-conductivity-type semiconductor layer is preferably disposed in such a manner that a distance between an end surface of the collector layer, the end surface contacting the base layer, and one junction interface selected from junction interfaces between the second-conductivity-type semiconductor layer and the first-conductivity-type semiconductor layers, the one junction interface being located on a base layer side, is in a distance range corresponding to 10% to 70% of a thickness of the collector layer.

This ensures reduced variations in base-to-collector capacitance.

Furthermore, the second-conductivity-type semiconductor layer is preferably disposed in such a manner that the distance between the end surface and the junction interface located on a base layer side is in a distance range corresponding to 30% to 60% of the thickness of the collector layer.

This ensures reduced variations in base-to-collector capacitance.

The second-conductivity-type semiconductor layer is preferably disposed between the first-conductivity-type semiconductor layers. The impurity concentration of the second-conductivity-type semiconductor layer is preferably set to less than that of a portion of each first-conductivity-type semiconductor layer, the portion contacting the second-conductivity-type semiconductor layer.

This also ensures reduced variations in base-to-collector capacitance.

A subcollector layer is preferably formed between a semiconductor substrate and the collector layer. The impurity concentration of the first-conductivity-type semiconductor layer is preferably set to have a tendency to increase from a second-conductivity-type semiconductor layer side to a subcollector layer side. The increasing tendency means that the impurity concentration monotonously increases, or means that if the impurity concentration does not increase in a stepwise manner and decreases in some areas, the impurity concentration generally increases from a second-conductivity-type semiconductor layer side to a subcollector layer side.

The first-conductivity-type semiconductor layer preferably includes an impurity concentration layer doped with an impurity and a first high-concentration layer having an impurity concentration more than the impurity concentration of the impurity concentration layer. The subcollector layer is preferably formed between the semiconductor substrate and the collector layer. The first high-concentration layer is preferably formed on a subcollector layer side, and the impurity concentration layer is preferably formed on a base layer side.

According to such a configuration, the electric field can be relaxed near the subcollector layer to increase the collector breakdown voltage.

According to an aspect of the position of the second-conductivity-type semiconductor layer, the second-conductivity-type semiconductor layer is preferably disposed between the impurity concentration layer and the first high-concentration layer. The first-conductivity-type semiconductor layer includes a low-concentration layer having an impurity concentration less than the impurity concentration of the impurity concentration layer. The low-concentration layer is preferably disposed between the second-conductivity-type semiconductor layer and the first high-concentration layer.

The first-conductivity-type semiconductor layer further includes a second high-concentration layer having an impurity concentration more than the impurity concentration of the impurity concentration layer. The second high-concentration layer is preferably disposed in contact with the base layer.

This can avoid the Kirk effect.

The first-conductivity-type semiconductor layer and the second-conductivity-type semiconductor layer are preferably formed of the same semiconductor. The emitter layer and the base layer preferably form a heterojunction. The band gap of the emitter layer is preferably set to be larger than the band gap of the base layer.

BRIEF DESCRIPTION OF DRAWINGS

FIG. 24 is a figure depicting the distribution of the impurity concentration of a base layer, a collector layer, and a subcollector layer in the fifth embodiment.

FIG. 25 is a figure depicting the distribution of the impurity concentration of a base layer, a collector layer, and a subcollector layer of a bipolar transistor according to a first modification in the fifth embodiment.

DETAILED DESCRIPTION

First Embodiment

As a semiconductor device according to a first embodiment, a first exemplary semiconductor device including a heterojunction bipolar transistor including one p-layer (p-type semiconductor layer) in a collector layer is described.

Figure 1:
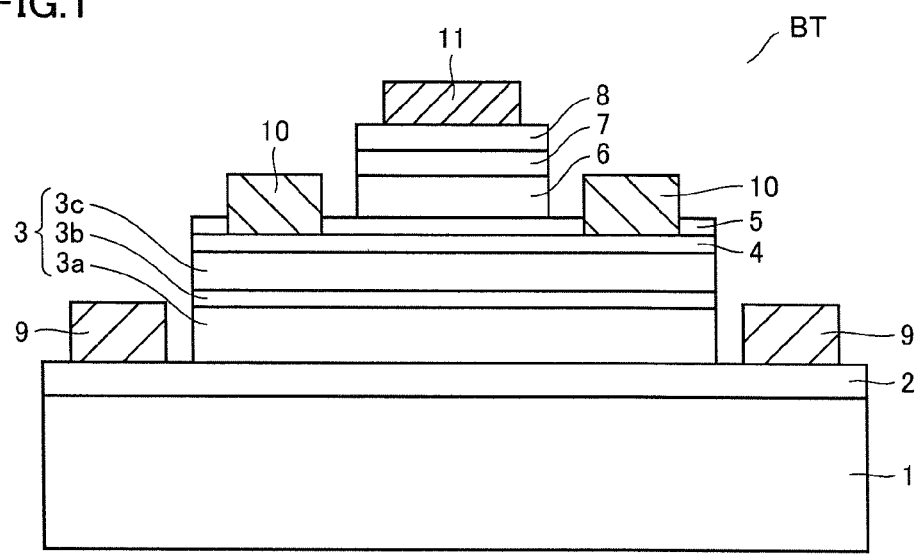
FIG. 1 is a cross-sectional view of a semiconductor device including a bipolar transistor according to a first embodiment of the present disclosure.
Figure 2:
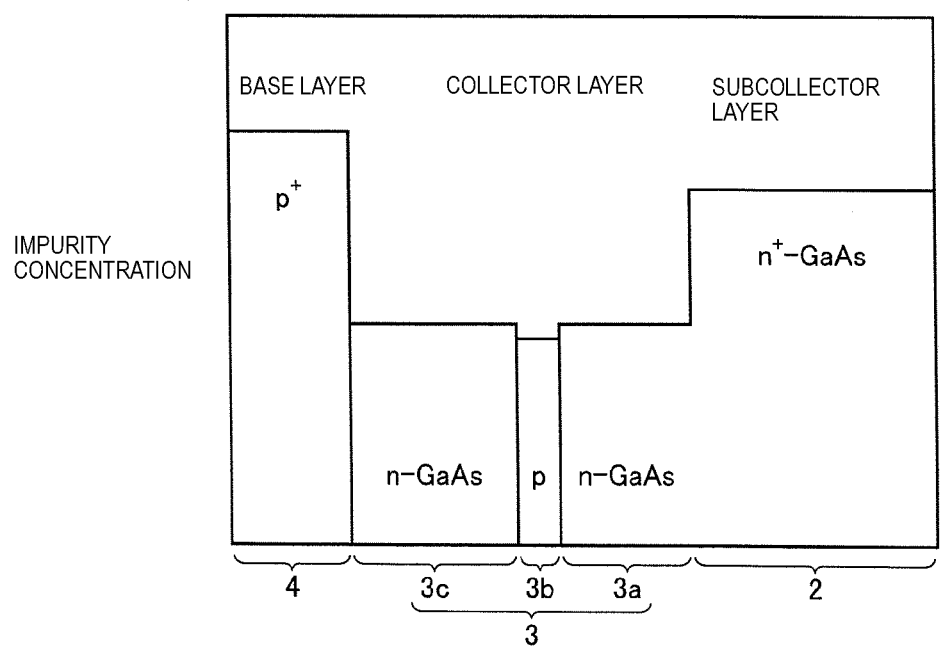
FIG. 2 is a figure depicting the distribution of the impurity concentration of a base layer, a collector layer, and a subcollector layer in the first embodiment.

As shown in FIG. 1 and FIG. 2, in a bipolar transistor BT, a subcollector layer 2 formed of an n-type GaAs layer (Si concentration: about $5 \times 10^{18}$ cm$^{-3}$, thickness: about 0.6 μm) is formed in contact with a surface of a semiconductor substrate 1 formed of, for example, semi-insulating GaAs. A collector layer 3 is formed in contact with the subcollector layer 2. A base layer 4 formed of a p-type GaAs layer (C concentration: about $4 \times 10^{18}$ cm$^{-3}$, thickness: about 100 nm) is formed in contact with the collector layer 3. An emitter layer 5 formed of an n-type In$_X$Ga$_{1-X}$P layer (In composition ratio: X=0.5, Si concentration: about $3 \times 10^{17}$ cm$^{-3}$, thickness: about 30 nm) is formed in contact with the base layer 4. Base electrodes 10 are formed so that the base electrodes 10 penetrate through the emitter layer 5 and contact the base layer 4.

An n-type GaAs layer 6 (Si concentration: about $3 \times 10^{17}$ cm$^{-3}$, thickness: about 90 nm) is formed in contact with the emitter layer 5. An n-type GaAs contact layer 7 (Si concentration: about $1 \times 10^{19}$ cm$^{-3}$, thickness: about 50 nm) is formed in contact with the n-type GaAs layer 6. An n-type In$_X$Ga$_{1-X}$As contact layer 8 (In composition ratio: X=0.5, Si concentration: about $1 \times 10^{19}$ cm$^{-3}$, thickness: about 50 nm) is formed in contact with the n-type GaAs contact layer 7. An emitter electrode 11 is formed in contact with the n-type In$_X$Ga$_{1-X}$As contact layer 8. Collector electrodes 9 are formed in contact with portions of the subcollector layer 2 located on both lateral sides of the collector layer 3.

Another stacked layer may be disposed between the semiconductor substrate 1 and the subcollector layer 2. Similarly, another layer may be formed between the subcollector layer 2 and the collector layer 3, between the collector layer 3 and the base layer 4, between the base layer 4 and the emitter layer 5, and/or between the emitter layer 5 and the n-type GaAs layer 6.

The collector electrode 9 is formed of a multilayer film in which, for example, a germanium gold (AuGe) film (thickness: about 60 nm), a nickel (Ni) film (thickness: about 10 nm), and a gold (Au) film (thickness: about 200 nm) are stacked in sequence. The base electrode 10 is formed of a multilayer film in which a titanium (Ti) film (thickness: about 50 nm), a platinum (Pt) film (thickness: about 50 nm), and a gold (Au) film (thickness: about 200 nm) are stacked in sequence. The emitter electrode 11 is formed of a tungsten silicide film (Si composition ratio: 0.3, thickness: about 0.3 μm).

In this bipolar transistor, the collector layer 3 includes three semiconductor layers: an n-type GaAs layer 3a (Si concentration: about $5 \times 10^{15}$ cm$^{-3}$, thickness: about 350 nm), a p-type GaAs layer 3b (C concentration: about $4.5 \times 10^{15}$ cm$^{-3}$, thickness: about 100 nm, sheet concentration: $4.5 \times 10^{10}$ cm$^{-2}$), and an n-type GaAs layer 3c (Si concentration: about $5 \times 10^{15}$ cm$^{-3}$, thickness: about 500 nm).

In the bipolar transistor BT described above, having one p-type GaAs layer 3b in the collector layer 3 reduces variations in base-to-collector capacitance Cbc and improves the linearity. The detailed description is provided below.

Figure 3:
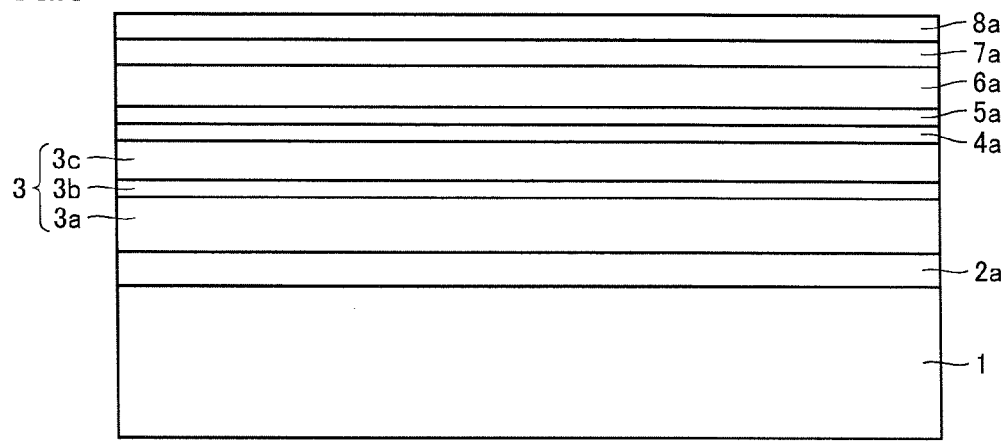
FIG. 3 is a cross-sectional view of a step in a method for producing the bipolar transistor in the first embodiment.

Next, an exemplary method for producing the heterojunction bipolar transistor BT described above is described. First, particular layers that will serve as a subcollector layer, a collector layer, a base layer, an emitter layer, a contact layer, and other layers are formed on the surface of a semiconductor substrate by an epitaxial growth method, such as a MOCVD (Metal Organic Chemical Vapor Deposition) method. As shown in FIG. 3, an n-type GaAs layer 2a that will serve as a subcollector layer is formed in contact with the surface of the semiconductor substrate 1. An n-type GaAs layer 3a that will serve as a first layer in the collector layer is formed in contact with the n-type GaAs layer 2a. A p-type GaAs layer 3b that will serve as a second layer in the collector layer is formed in contact with the n-type GaAs layer 3a. An n-type GaAs layer 3c that will serve as a third layer in the collector layer is formed in contact with the p-type GaAs layer 3b.

Next, a p-type GaAs layer 4a that will serve as a base layer is formed in contact with the n-type GaAs layer 3c. An n-type $In_xGa_{1-x}P$ layer 5a that will serve as an emitter layer is formed in contact with the p-type GaAs layer 4a. An n-type GaAs layer 6a is formed in contact with the n-type $In_xGa_{1-x}P$ layer 5a. An n-type GaAs layer 7a that will serve as a contact layer is formed in contact with the n-type GaAs layer 6a. An n-type $In_xGa_{1-x}As$ layer 8a that will serve as a contact layer is formed in contact with the n-type GaAs layer 7a.

Figure 4:
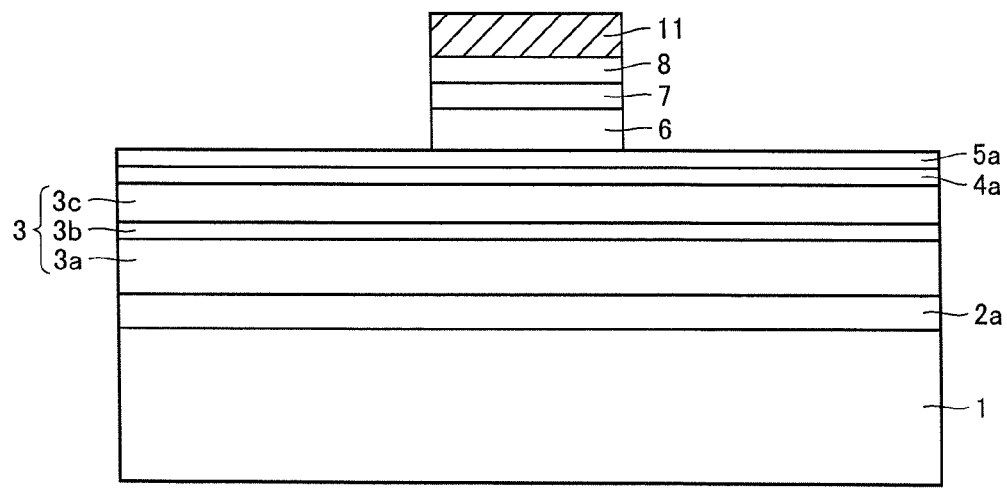
FIG. 4 is a cross-sectional view of a step performed after the step shown in FIG. 3 in the first embodiment.

Next, the n-type $In_xGa_{1-x}As$ layer 8a, the n-type GaAs layer 7a, and the n-type GaAs layer 6a are etched by using a particular photoresist mask (not shown) as an etching mask to form an n-type GaAs layer 6, an n-type GaAs contact layer 7, and an n-type $In_xGa_{1-x}As$ contact layer 8 (see FIG. 4). The photoresist mask is then removed. Next, as shown in FIG. 4, an emitter electrode 11 is formed on the surface of the n-type $In_xGa_{1-x}As$ contact layer 8.

Figure 5:
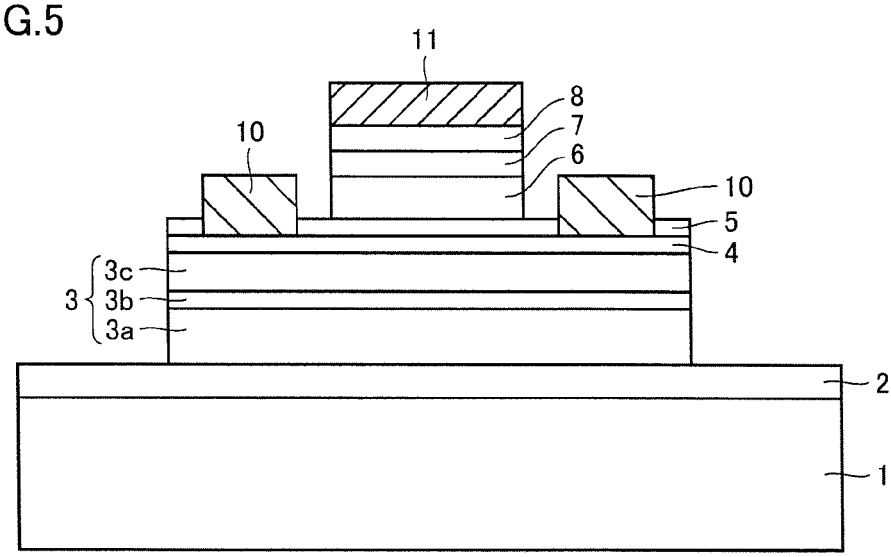
FIG. 5 is a cross-sectional view of a step performed after the step shown in FIG. 4 in the first embodiment.

Next, a photoresist mask (not shown) for patterning the emitter layer, the base layer, and other layers is formed. Next, using the photoresist mask as an etching mask, the n-type $In_xGa_{1-x}P$ layer 5a is etched, and then the p-type GaAs layer 4a, the n-type GaAs layer 3c, the p-type GaAs layer 3b, and the n-type GaAs layer 3a are etched to form the emitter layer 5, the base layer 4, and the collector layer 3 as shown in FIG. 5. The photoresist mask is then removed.

Figure 6:
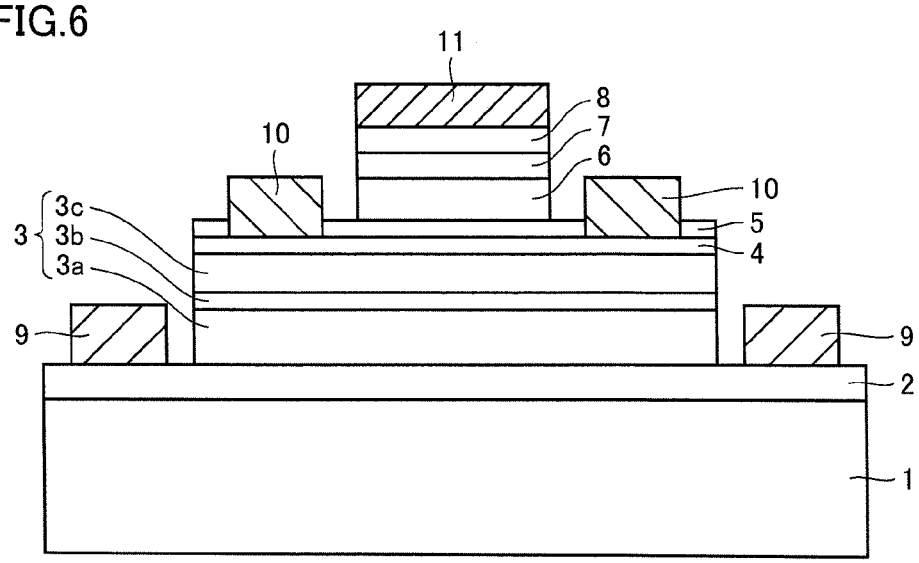
FIG. 6 is a cross-sectional view of a step performed after the step shown in FIG. 5 in the first embodiment.

Next, an area of the emitter layer 5 where a base electrode is to be formed is removed to expose the base layer 4, and a base electrode 10 in contact with the base layer 4 is then formed. Next, as shown in FIG. 6, a collector electrode 9 is formed in contact with the subcollector layer 2. As a result, the main part of the heterojunction bipolar transistor is formed.

In the collector layer 3 of the bipolar transistor described above, the p-type GaAs layer 3b as a p-layer (p-type semiconductor layer) is formed between the n-type GaAs layer 3a and the n-type GaAs layer 3c. The simulation result (graph) indicating the relationship between the base-to-collector capacitance Cbc and the base-to-collector voltage Vbc in this bipolar transistor is shown in FIG. 7 with the simulation results obtained from Comparative Example.

Figure 7:
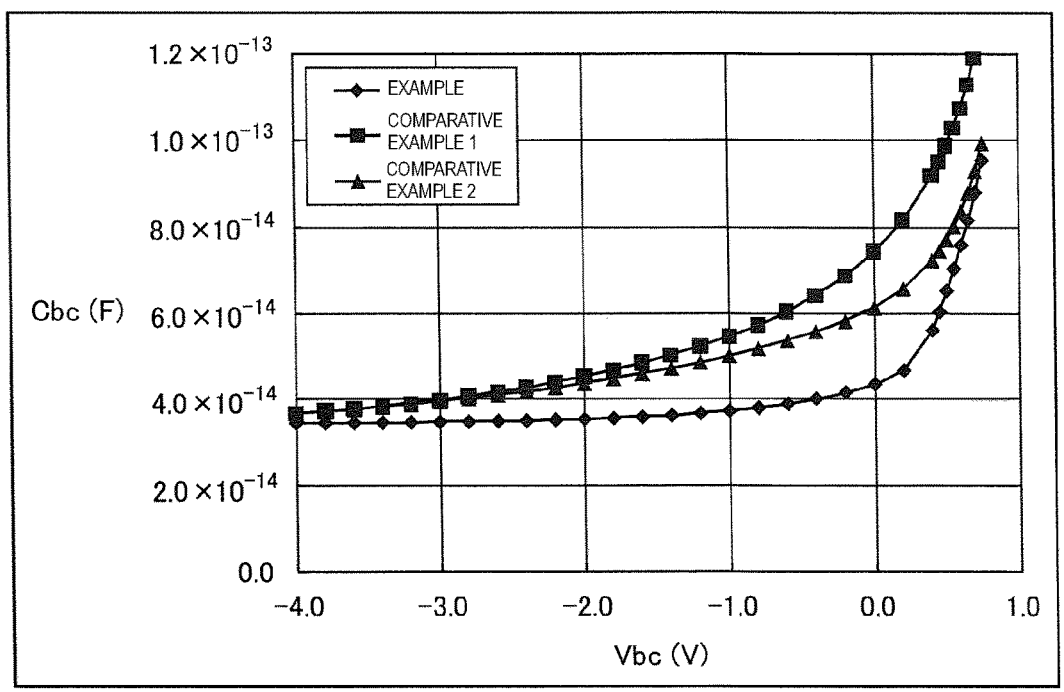
FIG. 7 is a graph depicting the relationship between the base-to-collector capacitance Cbc and the base-to-collector voltage Vbc in the first embodiment.

As shown in FIG. 7, the formation of the p-type GaAs layer 3b in the bipolar transistor described above reduces increases in base-to-collector capacitance Cbc until the base-to-collector voltage Vbc reaches positive values and thus improves the linearity compared with Comparative Example 1 (first example of the prior art) and Comparative Example 2 (second example of the prior art). Furthermore, setting the sheet concentration of the p-type GaAs layer 3b to be less than a particular concentration avoids a significant increase in base-to-collector capacitance Cbc in operation at relatively high current (in high-current operation) compared with the base-to-collector capacitance Cbc in operation at relatively low current (in low-current operation).

Thus, the linearity of the base-to-collector capacitance Cbc can be obtained in a wide base-to-collector voltage Vbc range including the range where the pn-junction between the base and the collector is forward biased (Vbc>0), regardless of high current operation or low current operation. The detailed description is provided below.

Figure 8:
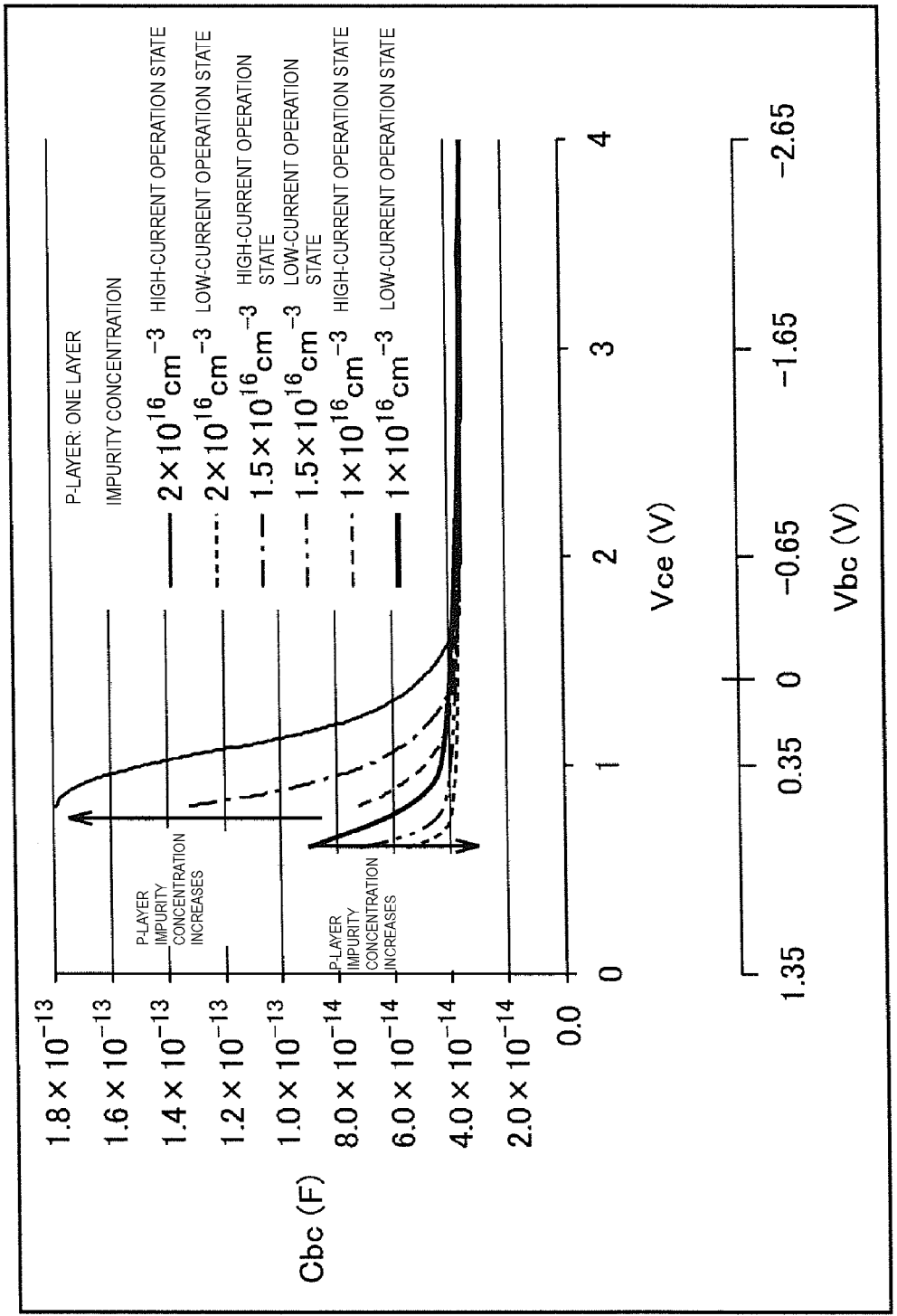
FIG. 8 is a graph depicting the relationship between the base-to-collector capacitance Cbc and the collector-to-emitter voltage Vce in low-current operation and high-current operation for description of operational advantages in the first embodiment.

First, FIG. 8 shows the graph indicating the relationship between (characteristics of) the base-to-collector capacitance Cbc and the collector-to-emitter voltage Vce in low-current operation and high-current operation with different impurity concentrations (doping concentrations) of the p-layer (p-type GaAs layer 3b). FIG. 8 indicates that the base-to-collector capacitance Cbc decreases with increasing impurity concentration of the p-layer in low-current operation, and the base-to-collector capacitance Cbc maintains its linearity until reaching the region where the collector-to-emitter voltage Vce is less than about 1.35 V (Vce<1.35 V).

However, it is found that, as the impurity concentration of the p-layer increases in high-current operation, the base-to-collector capacitance Cbc notably increases and linearity is degraded. This shows the inverse relationship between the low-current operation and the high-current operation in linearity of the base-to-collector capacitance Cbc when the impurity concentration of the p-layer is high, which suggests the linearity of the base-to-collector capacitance Cbc cannot be obtained in both low-current operation and high-current operation.

Assuming the base-to-emitter voltage Vbe is 1.35 V (Vbe=1.35 V), a collector-to-emitter voltage Vce region less than about 1.35 V (Vce<1.35 V) corresponds to a base-to-collector voltage Vbc region (Vbc>0 V) since the pn-junction between the base and the collector is forward biased. When the horizontal axis of the graph of low-current operation shown in FIG. 8 indicates the base-to-collector voltage Vbc instead of the collector-to-emitter voltage Vce, the graph corresponds to the relationship between the base-to-collector capacitance Cbc and the base-to-collector voltage Vbc shown in FIG. 7 (characteristics of Example).

Figure 9:
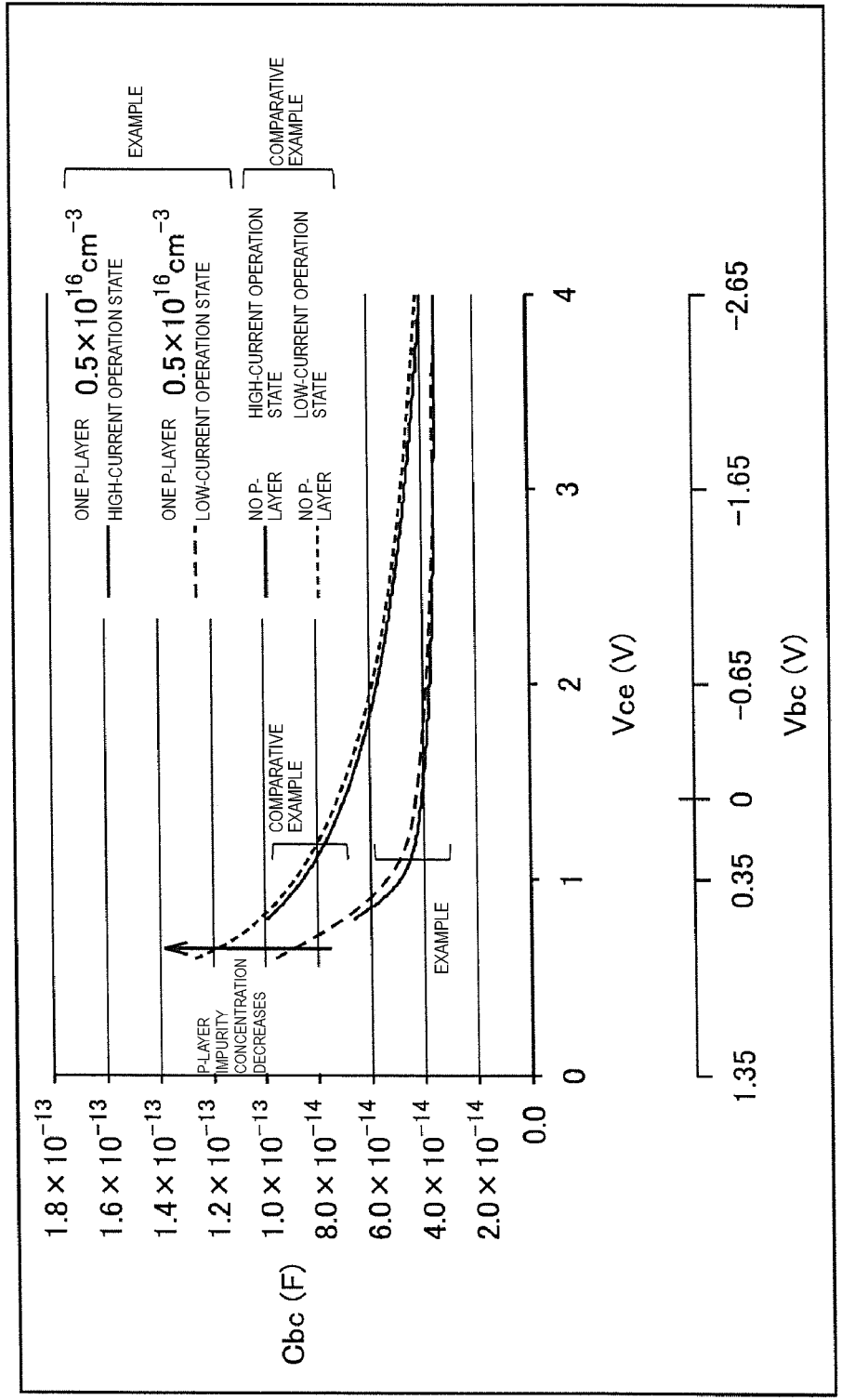
FIG. 9 is a graph depicting the relationship between the base-to-collector capacitance Cbc and the collector-to-emitter voltage Vce for description of operational advantages in the first embodiment.

The inventors have found that the inverse relationship between the low-current operation and the high-current operation in linearity of the base-to-collector capacitance Cbc can be dissolved by setting the impurity concentration (sheet concentration) of the p-layer in the collector layer to less than a predetermined value. FIG. 9 is a graph depicting the relationship between the base-to-collector capacitance Cbc and the collector-to-emitter voltage Vce (or the base-to-collector voltage Vbc), together with Comparative Example with no p-layer, when the impurity concentration of the p-layer is set to $0.5 \times 10^{16}$ cm$^{-3}$. The sheet concentration of the p-layer here is $0.5 \times 10^{11}$ cm$^{-2}$ assuming that the p-layer has a thickness of 100 nm.

In the bipolar transistor described above (Example), the base-to-collector capacitance Cbc in low-current operation and the base-to-collector capacitance Cbc in high-current operation have small differences and substantially identical characteristics, which suggests that the linearity can be obtained in both low current operation and high-current operation in a wide collector-to-emitter voltage Vce range from 0.8 V to 4 V (corresponding to Vbc=−2.65 V to 0.55 V).

In terms of specific values, the change in base-to-collector capacitance Cbc on a capacitance ratio basis in this collector-to-emitter voltage Vce range is about 2.5 for Comparative Example and is about 1.9 for Example, which shows that the change in base-to-collector capacitance Cbc is significantly reduced.

Figure 10:
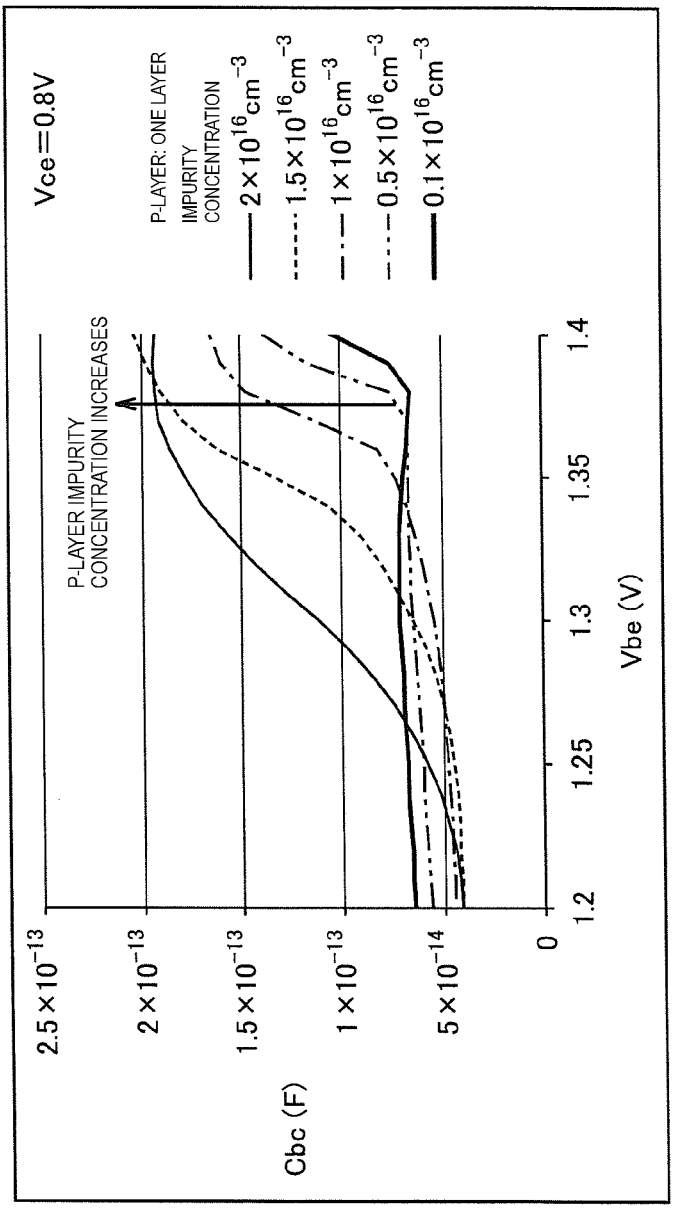
FIG. 10 is a graph depicting the relationship between the base-to-collector capacitance Cbc and the base-to-emitter voltage Vbe when the collector-to-emitter voltage Vce is fixed at a predetermined voltage, for description of operational advantages in the first embodiment.

The relationship between the base-to-collector capacitance Cbc and the collector-to-emitter voltage Vce is described from a different point of view. The relationship between (characteristics of) the base-to-collector capacitance Cbc and the base-to-emitter voltage Vbe when the collector-to-emitter voltage Vce is fixed at 0.8 V (Vce=0.8 V) is shown in FIG. 10.

When the impurity concentration of the p-layer is as low as $0.5 \times 10^{16}$ cm$^{-3}$ or less, no rapid change in base-to-collector capacitance Cbc is observed in the base-to-emitter voltage Vbe range from 1.2 V to 1.37 V (Vbe=1.2 V to 1.37 V). In contrast, when the impurity concentration of the p-layer is equal to or more than $1.0 \times 10^{16}$ cm$^{-3}$, an increase in base-to-collector capacitance Cbc is observed. In particular, the base-to-collector capacitance Cbc tends to increase rapidly when the impurity concentration of the p-layer is $1.5\times10^{16}$ cm$^{-3}$ or $2\times10^{16}$ cm$^{-3}$.

Figure 11:
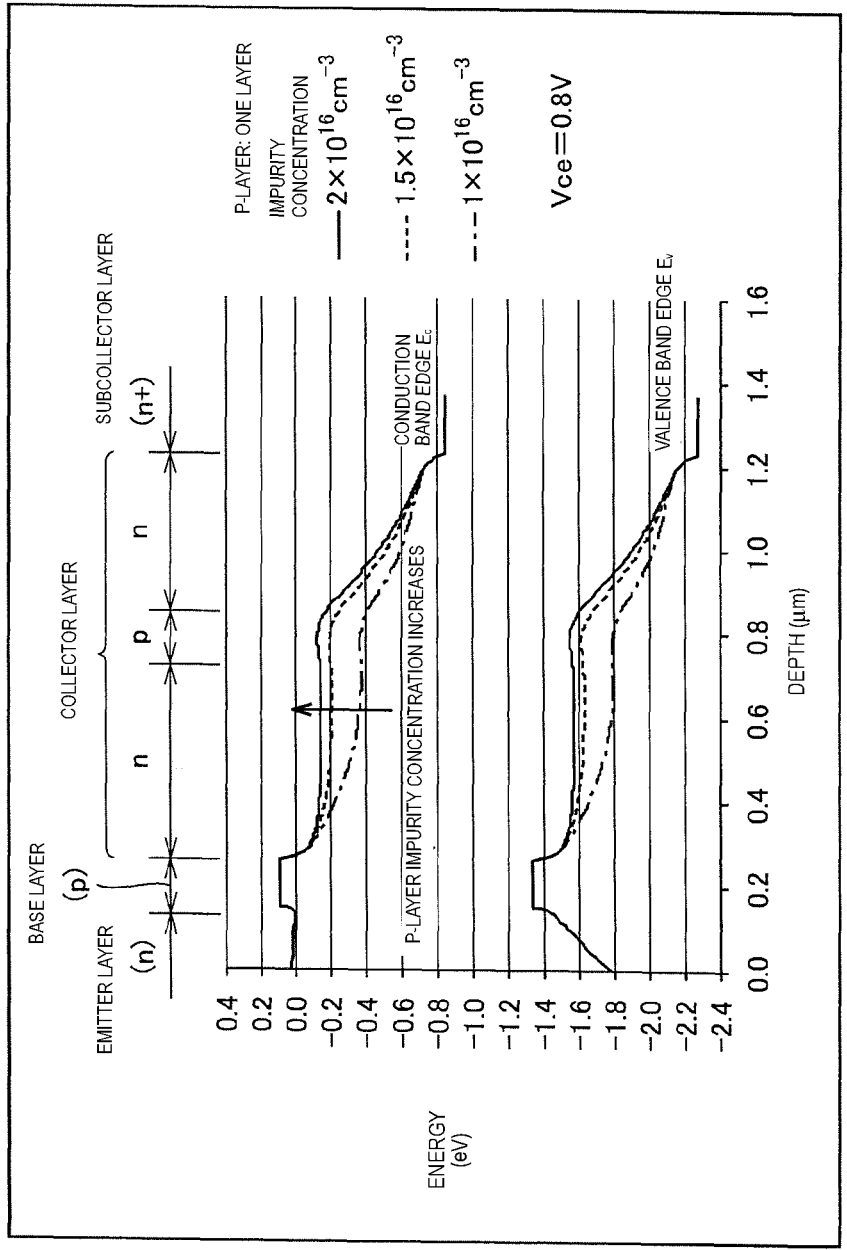
FIG. 11 is an energy band depicting the relationship between the energy of the conduction band and the valence band and the depth direction from the emitter layer to the subcollector layer when the collector-to-emitter voltage Vce is fixed at a predetermined voltage, for description of operational advantages in the first embodiment.
Figure 12:
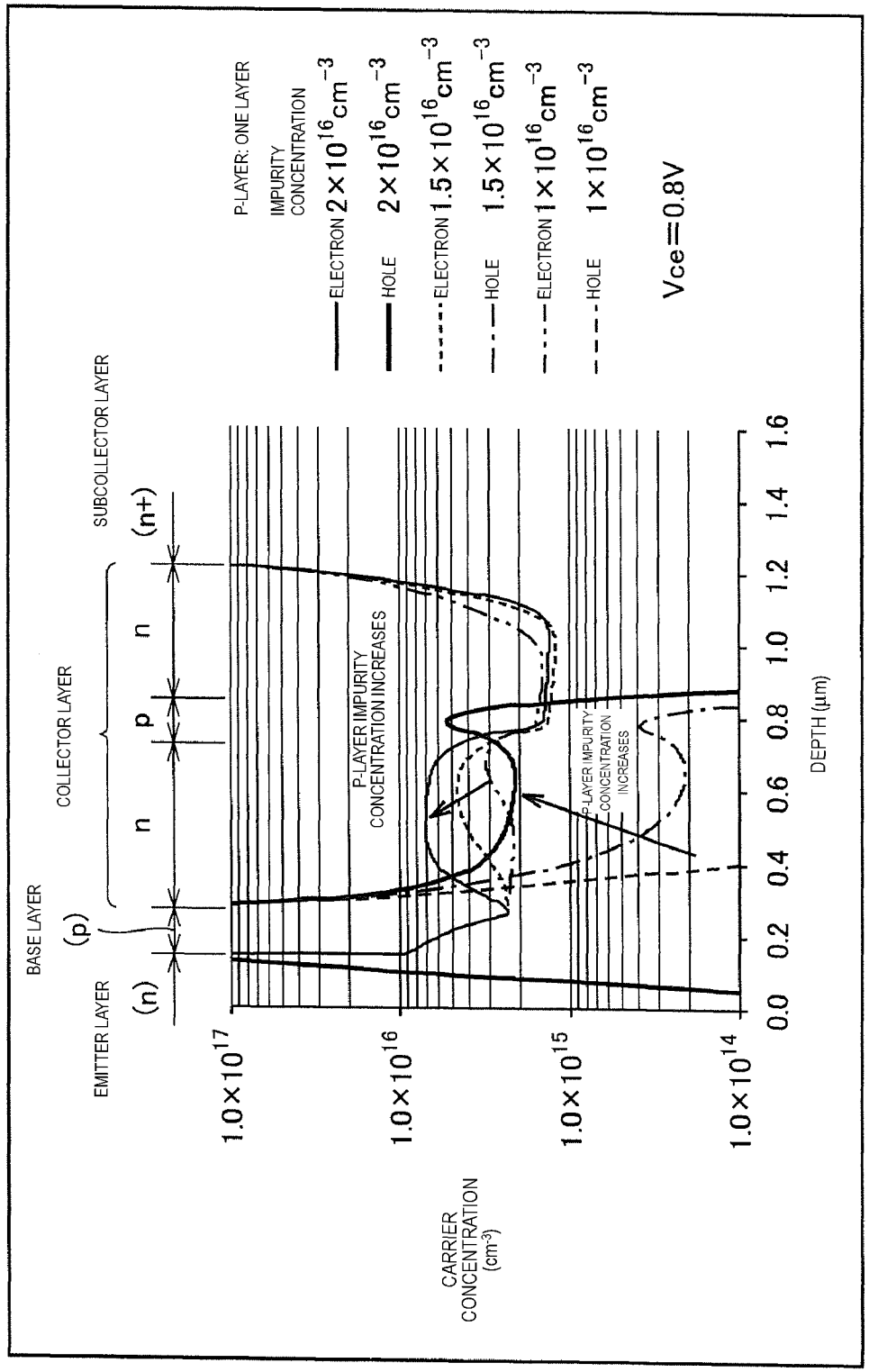
FIG. 12 is a graph depicting the relationship between the carrier concentration and the depth direction from the emitter layer to the subcollector layer when the collector-to-emitter voltage Vce is fixed at a predetermined voltage, for description of operational advantages in the first embodiment.

The reason for this tendency is as follows. FIG. 11 shows the relationship (in energy band) between the energy of the conduction band and the valence band and the depth direction (position) from the emitter layer to the subcollector layer in high-current operation when the collector-to-emitter voltage Vce is fixed at 0.8 V (Vce=0.8 V). FIG. 12 shows the relationship between the carrier concentration and the depth direction (position) from the emitter layer to the subcollector layer in high-current operation when the collector-to-emitter voltage Vce is fixed at 0.8 V (Vce=0.8 V).

FIG. 11 indicates that, as the impurity concentration of the p-layer increases, in the energy bands of the conduction band or the valence band, a flat area indicating substantially constant energy appears and a raised area indicating high energy appears particularly in the region where the p-layer is located. As shown in FIG. 12, electrons and holes easily accumulate at positions corresponding to these areas. As a result, in high-current operation, the base-to-collector capacitance Cbc increases by the amount corresponding to the accumulated electrons and holes.

In contrast, as the impurity concentration of the p-layer decreases, the flat area indicating substantially constant energy is made smaller and the raised area indicating high energy is also flattened in the energy bands of the conduction band or the valence band. As shown in FIG. 12, thus electrons and holes no longer accumulate. As a result, an increase in base-to-collector capacitance Cbc can be reduced in high-current operation.

In this case, the p-layer impurity concentration that can reduce an increase in base-to-collector capacitance Cbc is preferably less than $1\times10^{16}$ cm$^{-3}$. Based on the sheet concentration of the p-layer, the sheet concentration is preferably less than $1\times10^{11}$ cm$^{-2}$ since the p-layer has a thickness of 100 nm.

When the collector layer includes the p-layer (p-type GaAs layer), the tendency in which the flat area indicating substantially constant energy and other areas appear in the energy bands is enhanced by increasing the impurity concentration of the p-layer and the thickness of the p-layer, that is, by increasing the sheet concentration. In other words, this tendency is enhanced not only by increasing the impurity concentration of the p-layer, but also by increasing the thickness of the p-layer.

Therefore, in order to ensure the linearity of the base-to-collector capacitance Cbc in high-current operation, the flat area indicating substantially constant energy and other areas can be eliminated by reducing the impurity concentration of the p-layer, decreasing the thickness of the p-layer, and setting the sheet concentration of the p-layer to less than $1\times10^{11}$ cm$^{-2}$. In contrast, setting the sheet concentration of the p-layer to $1\times10^{11}$ cm$^{-2}$ or more makes it difficult to obtain the linearity of the base-to-collector capacitance Cbc particularly in high-current operation.

Figure 13:
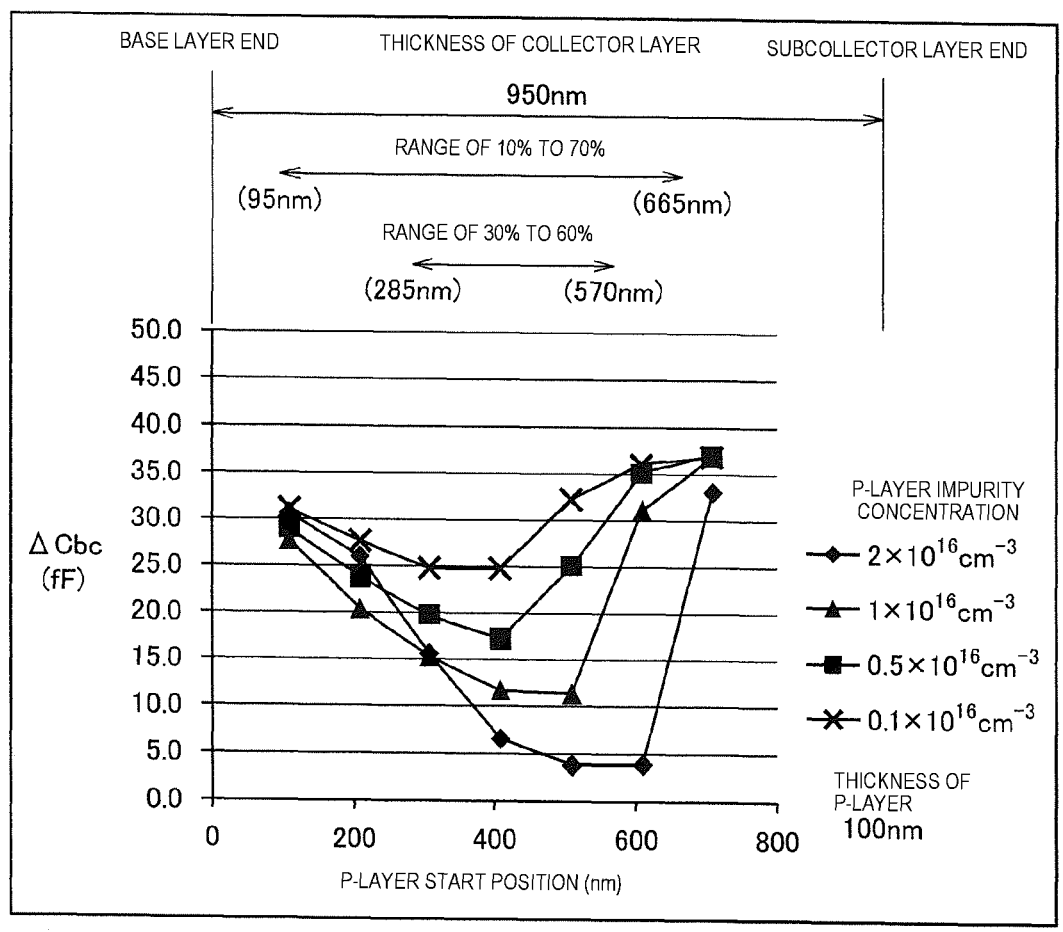
FIG. 13 is a graph depicting the relationship between the capacitance difference ΔCbc of the base-to-collector capacitance Cbc and the p-layer start position for description of operational advantages in the first embodiment.

The linearity of the base-to-collector capacitance Cbc can also be improved by the position of the p-layer formed in the collector layer. FIG. 13 shows the relationship between the capacitance difference ΔCbc of the base-to-collector capacitance Cbc and the p-layer start position. The capacitance difference ΔCbc of the base-to-collector capacitance Cbc refers to, for example, the difference between the base-to-collector capacitance Cbc when the collector-to-emitter voltage Vce is 0.8 V (Vce=0.8 V) and the base-to-collector capacitance Cbc when the collector-to-emitter voltage Vce is 3.3 V (Vce=3.3 V). A smaller capacitance difference ΔCbc of the base-to-collector capacitance Cbc means better linearity. The p-layer start position refers to the distance (depth) from the base layer end (interface between the base layer and the collector layer) to one junction interface selected from junction interfaces between the p-layer (p-type semiconductor layer) and the n-layers (n-type semiconductor layers) in the collector layer, the one junction interface being located on a base layer side.

FIG. 13 indicates that the capacitance difference ΔCbc of the base-to-collector capacitance Cbc can be reduced and the linearity can be improved by forming the p-layer in such a manner that the p-layer start position is in the range where the distance from the base layer end corresponds to 10% to 70% of the thickness of the collector layer. Particularly when the impurity concentration of the p-layer is less than $1\times10^{16}$ cm$^{-3}$, the capacitance difference ΔCbc of the base-to-collector capacitance Cbc can be reduced and the linearity can be improved by forming the p-layer in such a manner that the p-layer start position is in the range where the distance from the base layer end corresponds to 30% to 60% of the thickness of the collector layer.

When the p-layer is formed to have a p-layer start position in the range where the distance from the base layer end corresponds to more than 70% of the thickness of the collector layer, a neutral region is formed between the p-layer and a depletion layer located on a base layer side, and the depletion layer located on a base layer side does not extend beyond a depletion layer extending when the p-layer is not formed. Accordingly, the thickness of the depletion layer, which determines the base-to-collector capacitance Cbc, equals the thickness of the depletion layer extending when p-layer is not formed, and the capacitance difference ΔCbc of the base-to-collector capacitance Cbc thus increases.

When the p-layer is formed to have a p-layer start position in the range where the distance from the base layer end corresponds to less than 30% of the thickness of the collector layer, the p-layer is close to the base layer and a tendency to be integrated with the base layer (p-layer) increases, resulting in a reduced thickness of the depletion layer. Accordingly, the capacitance difference ΔCbc of the base-to-collector capacitance Cbc increases.

The capacitance difference ΔCbc of the base-to-collector capacitance Cbc can be reduced and the linearity of the base-to-collector capacitance Cbc can be improved by forming the p-layer in such a manner that the p-layer start position is in the range where the distance from the base layer end corresponds to 10% to 70% of the thickness of the collector layer. More preferably, the linearity of the base-to-collector capacitance Cbc can be further improved by forming the p-layer in such a manner that the p-layer start position is in a distance range corresponding to 30% to 60% of the thickness.

In the latter case, for example, when three semiconductor layers, namely, an n-type GaAs layer 3a (Si concentration: about $5\times10^{15}$ cm$^{-3}$, thickness: about 550 nm), a p-type GaAs layer 3b (C concentration: about $4.5\times10^{15}$ cm$^{-3}$, thickness: about 100 nm, sheet concentration: $4.5\times10^{10}$ cm$^{-2}$), and an n-type GaAs layer 3c (Si concentration: about $5\times10^{15}$ cm$^{-3}$, thickness: about 300 nm) are formed to constitute the collector layer, the p-layer (p-type GaAs layer 3b) comes to be positioned in such a manner that the p-layer start position is in the range where the distance from the base layer end corresponds to 30% to 60% of the thickness of the collector layer. As a result, the linearity of the base-to-collector capacitance Cbc can be assuredly improved.

Second Embodiment

As a semiconductor device according to a second embodiment, a second exemplary semiconductor device including a heterojunction bipolar transistor including one p-layer (p-type semiconductor layer) in a collector layer is described.

Figure 14:
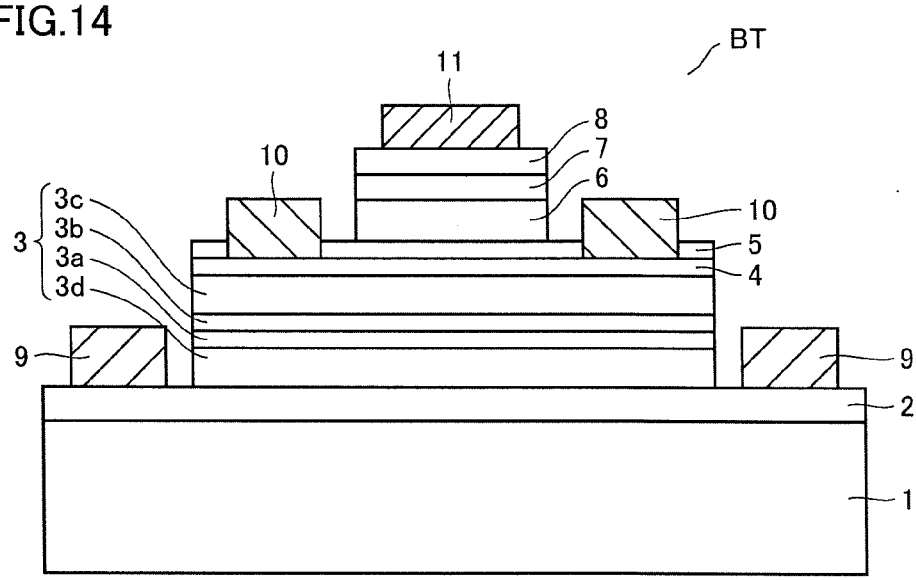
FIG. 14 is a cross-sectional view of a semiconductor device including a bipolar transistor according to a second embodiment of the present disclosure.
Figure 15:
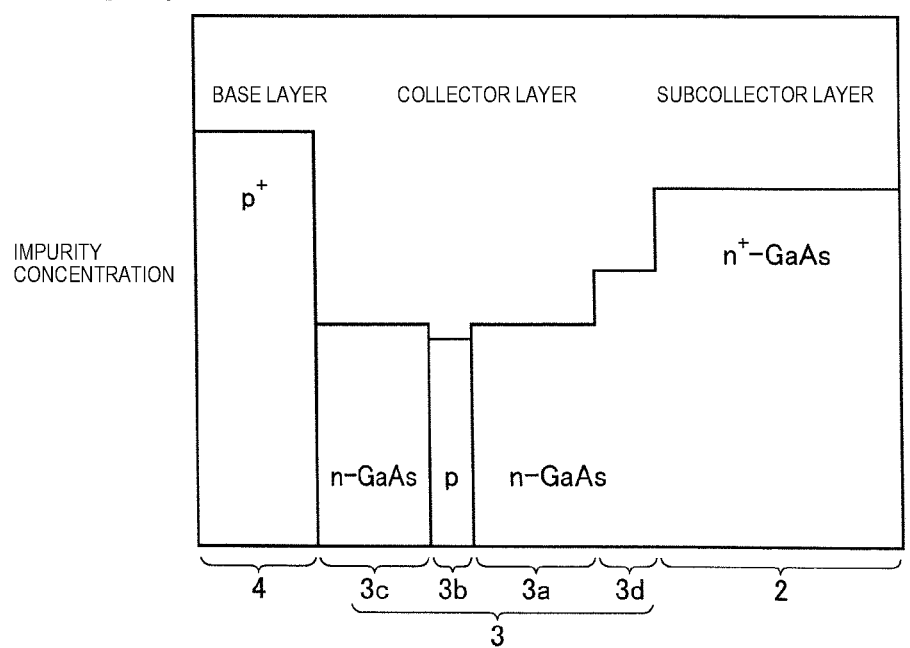
FIG. 15 is a figure depicting the distribution of the impurity concentration of a base layer, a collector layer, and a subcollector layer in the second embodiment.

As shown in FIG. 14 and FIG. 15, in this bipolar transistor BT, the collector layer 3 includes four semiconductor layers: an n-type GaAs layer 3d (Si concentration: about $11\times10^{15}$ $cm^{-3}$, thickness: about 450 nm), an n-type GaAs layer 3a (Si concentration: about $5\times10^{15}$ $cm^{-3}$, thickness: about 100 nm), a p-type GaAs layer 3b (C concentration: about $4.5\times10^{15}$ $cm^{-3}$, thickness: about 100 nm, sheet concentration: $4.5\times10^{10}$ $cm^{-2}$), and an n-type GaAs layer 3c (Si concentration: about $5\times10^{15}$ $cm^{-3}$, thickness: about 300 nm).

The sheet concentration of the p-type GaAs layer 3b here is $4.5\times10^{10}$ $cm^{-2}$, which is set to less than $1\times10^{11}$ $cm^{-2}$. The n-type GaAs layer 3d is formed between the n-type GaAs layer 3a and the subcollector layer 2. The impurity concentration of the n-type GaAs layer 3d (Si concentration: about $11\times10^{15}$ $cm^{-3}$) is set to be more than the impurity concentration of the n-type GaAs layer 3a (Si concentration: about $5\times10^{15}$ $cm^{-3}$), and set to be less than the impurity concentration of the subcollector layer 2 (Si concentration: about $5\times10^{18}$ $cm^{-3}$). Since other members are the same as in the bipolar transistor shown in FIG. 1, the same members are denoted by the same reference numerals and description thereof is not repeated unless the description is necessary.

The bipolar transistor BT described above can be formed through substantially the same steps to those in the method for producing the bipolar transistor shown in FIG. 1 by additionally forming the n-type GaAs layer 3d between the step of forming the n-type GaAs layer 2a that will serve as a subcollector layer and the step of forming the n-type GaAs layer 3a.

Figure 16:
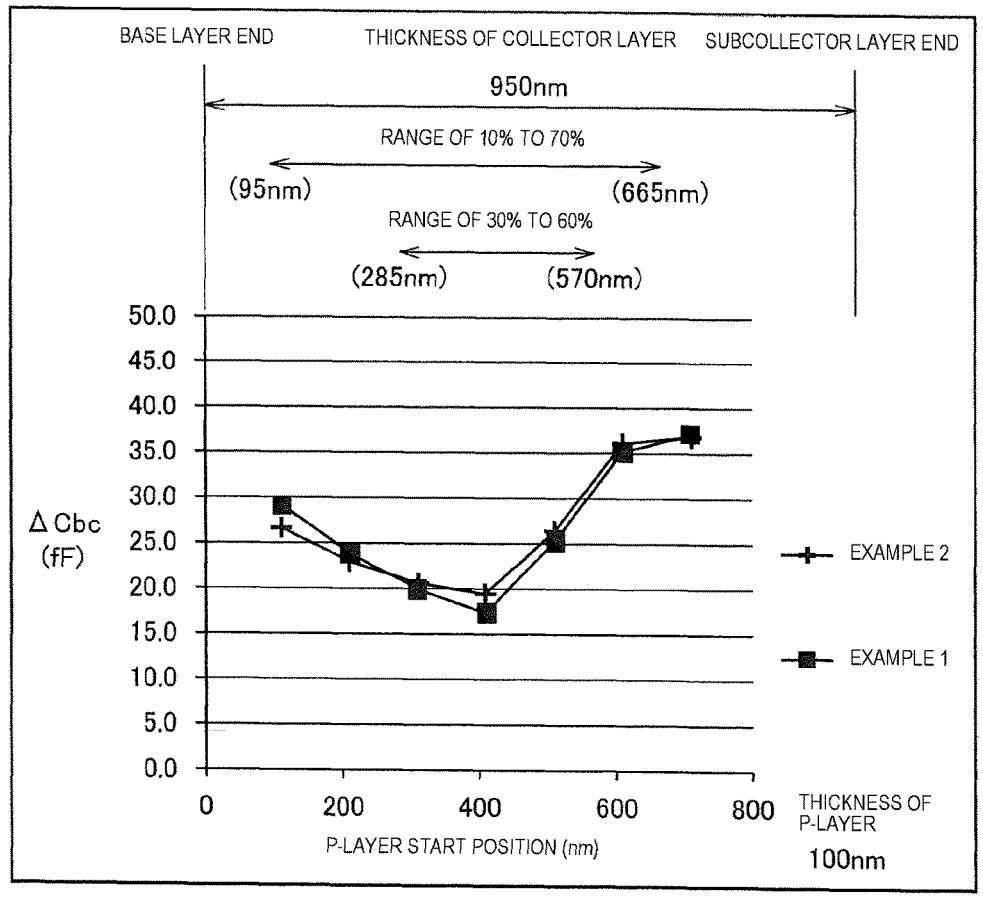
FIG. 16 is a graph depicting the relationship between the capacitance difference ΔCbc of the base-to-collector capacitance Cbc and the p-layer start position for description of operational advantages in the second embodiment.

In the bipolar transistor described above, the linearity of the base-to-collector capacitance can be improved in the same manner as in the bipolar transistor shown in FIG. 1 since the p-type GaAs layer 3b as a p-layer is included in the collector layer 3. FIG. 16 is a graph depicting the relationship between the capacitance difference ΔCbc of the base-to-collector capacitance Cbc and the p-layer start position in the bipolar transistor described above (Example 2) as well as the relationship in the bipolar transistor shown in FIG. 1 (Example 1).

FIG. 16 shows that the capacitance difference ΔCbc of the bipolar transistor described above is substantially identical to the capacitance difference ΔCbc of the bipolar transistor shown in FIG. 1, and good linearity is obtained. In particular, the capacitance difference ΔCbc of the base-to-collector capacitance Cbc is reduced and the linearity of the base-to-collector capacitance Cbc is improved by forming the p-layer in such a manner that the p-layer start position is in the range where the distance from the base layer end corresponds to 10% to 70% of the thickness of the collector layer. More preferably, the linearity of the base-to-collector capacitance Cbc can be further improved by forming the p-layer in such a manner that the p-layer start position is in a distance range corresponding to 30% to 60% of the thickness.

The bipolar transistor BT described above accordingly can ensure the linearity of the base-to-collector capacitance Cbc, reduce modulation distortion, and reduce variations in collector voltage for power gain in a wide collector-to-emitter voltage Vce range from 0.8 V to 4 V (corresponding to Vbc=−2.65 V to 0.55 V) in both low-current operation and high-current operation, as described in the first embodiment.

Furthermore, the n-type GaAs layer 3d is formed between the n-type GaAs layer 3a and the subcollector layer 2 in the bipolar transistor BT described above. The impurity concentration of the n-type GaAs layer 3d is set to be more than the impurity concentration of the n-type GaAs layer 3a, and set to be less than the impurity concentration of the subcollector layer 2. As a result, the electric field can be relaxed near the subcollector layer 2 to improve the collector breakdown voltage during operation of the bipolar transistor.

Figure 17:
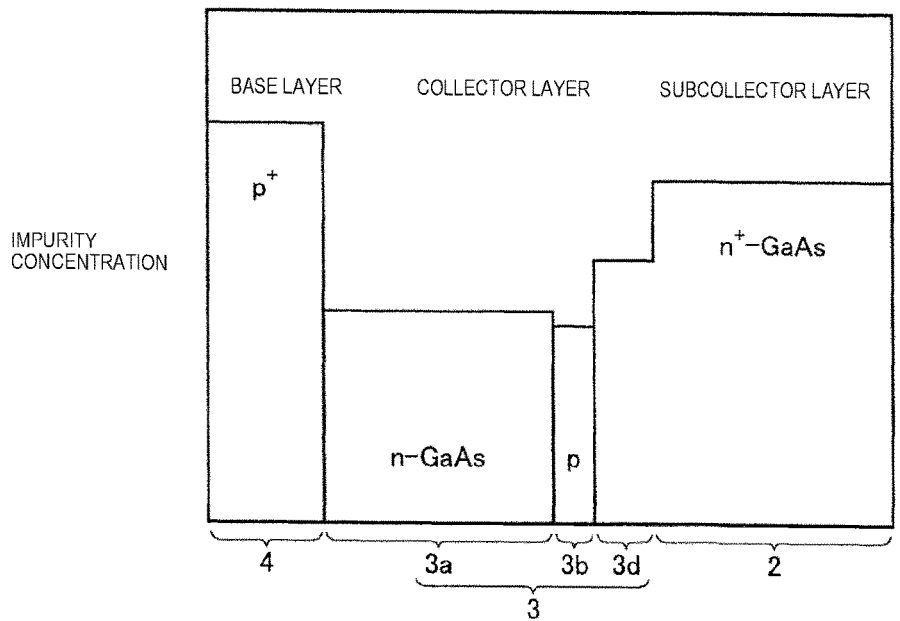
FIG. 17 is a figure depicting the distribution of the impurity concentration of a base layer, a collector layer, and a subcollector layer of a bipolar transistor according to a modification in the second embodiment.

As a bipolar transistor according to a modification, the p-type GaAs layer 3b may be disposed in contact with the n-type GaAs layer 3d, as shown in FIG. 17. The bipolar transistor having such a collector layer 3 can have improved linearity of the base-to-collector capacitance Cbc and improved collector breakdown voltage.

Third Embodiment

As a semiconductor device according to a third embodiment, a third exemplary semiconductor device including a heterojunction bipolar transistor including one p-layer (p-type semiconductor layer) in a collector layer is described.

Figure 18:
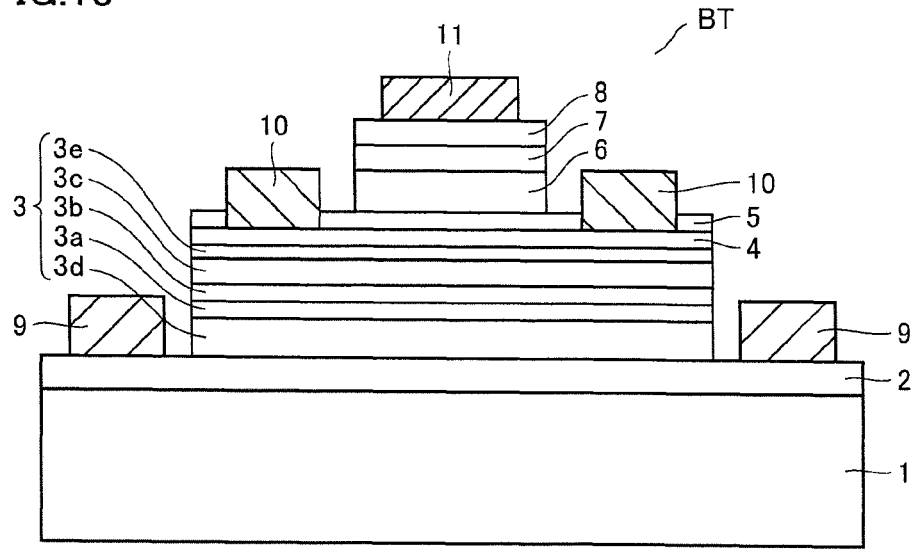
FIG. 18 is a cross-sectional view of a semiconductor device including a bipolar transistor according to a third embodiment of the present disclosure.
Figure 19:
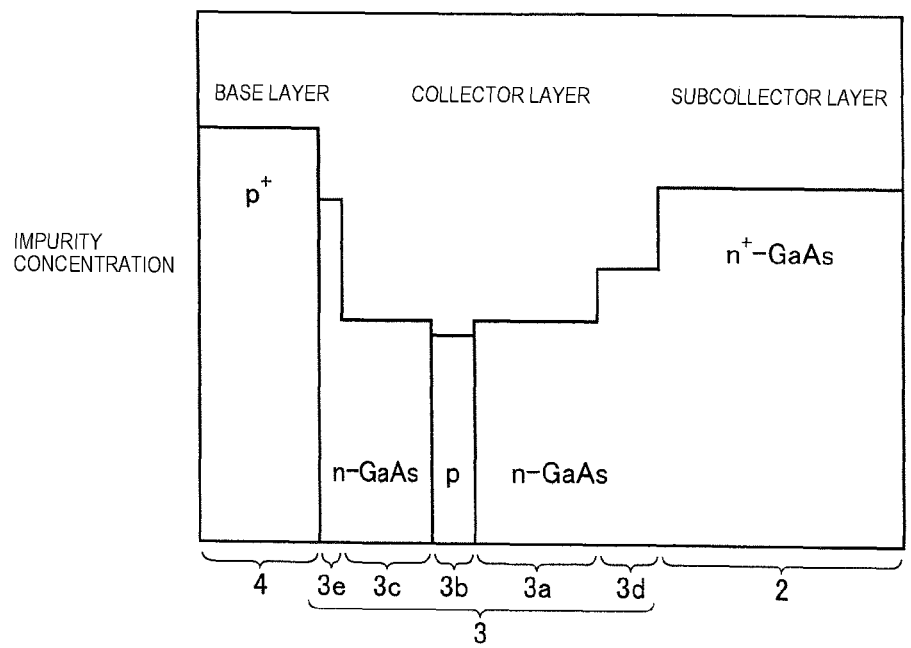
FIG. 19 is a figure depicting the distribution of the impurity concentration of a base layer, a collector layer, and a subcollector layer in the third embodiment.

As shown in FIG. 18 and FIG. 19, in this bipolar transistor BT, the collector layer 3 includes five semiconductor layers: an n-type GaAs layer 3d (Si concentration: about $11\times10^{15}$ $cm^{-3}$, thickness: about 450 nm), an n-type GaAs layer 3a (Si concentration: about $5\times10^{15}$ $cm^{-3}$, thickness: about 100 nm), a p-type GaAs layer 3b (C concentration: about $4.5\times10^{15}$ $cm^{-3}$, thickness: about 100 nm, sheet concentration: $4.5\times10^{10}$ $cm^{-2}$), an n-type GaAs layer 3c (Si concentration: about $5\times10^{15}$ $cm^{-3}$, thickness: about 300 nm), and an n-type GaAs layer 3e (Si concentration: about $1\times10^{18}$ $cm^{-3}$, thickness: about 10 nm).

The sheet concentration of the p-type GaAs layer 3b is $4.5\times10^{10}$ $cm^{-2}$, which is set to less than $1\times10^{11}$ $cm^{-2}$. The n-type GaAs layer 3e is formed between the n-type GaAs layer 3c and the base layer 4 (C concentration: about $4\times10^{19}$ $cm^{-3}$, thickness: about 100 nm). The impurity concentration of the n-type GaAs layer 3e is set to be more than the impurity concentration of the n-type GaAs layer 3c. Since other members are the same as in the bipolar transistor shown in FIG. 14 (or FIG. 1), the same members are denoted by the same reference numerals and description thereof is not repeated unless the description is necessary.

The bipolar transistor BT described above can be formed through substantially the same steps to those in the method for producing the bipolar transistor shown in FIG. 14 (or FIG. 1) by additionally forming the n-type GaAs layer 3e between the step of forming the n-type GaAs layer 3c that will serve as a collector layer and the step of forming the p-type GaAs layer 4a that will serve as a base layer.

In the bipolar transistor BT described above, the collector layer 3 includes the p-type GaAs layer 3b. The bipolar transistor BT described above thus can ensure the linearity of the base-to-collector capacitance Cbc, reduce modulation distortion, and reduce variations in collector voltage for power gain as described in the first embodiment and the like in a wide collector-to-emitter voltage Vce range from 0.8 V to 4 V (corresponding to Vbc=−2.65 V to 0.55 V) in both low-current operation and high-current operation.

In addition, in the bipolar transistor described above, the n-type GaAs layer 3e is formed between the n-type GaAs layer 3c and the base layer 4. The impurity concentration of the n-type GaAs layer 3e is set to be more than the impurity concentration of the n-type GaAs layer 3c. This configuration can reduce a so-called Kirk effect, which causes a space-charge region at the junction between the base layer 4 and the collector layer 3 to be pushed out to the collector layer 3 due to an increase in current density; thus a decrease in deterioration of high frequency characteristics, such as reduced cutoff frequency ft, can be reduced.

As a bipolar transistor according to a modification, the p-type GaAs layer 3b may be disposed in contact with the n-type GaAs layer 3d in the same manner as in the bipolar transistor according to the modification described in the second embodiment. The bipolar transistor including such a collector layer 3 can have improved linearity of the base-to-collector capacitance Cbc and improved collector breakdown voltage.

Fourth Embodiment

As a semiconductor device according to a fourth embodiment, a fourth exemplary semiconductor device including a heterojunction bipolar transistor including one p-layer (p-type semiconductor layer) in a collector layer is described.

Figure 20:
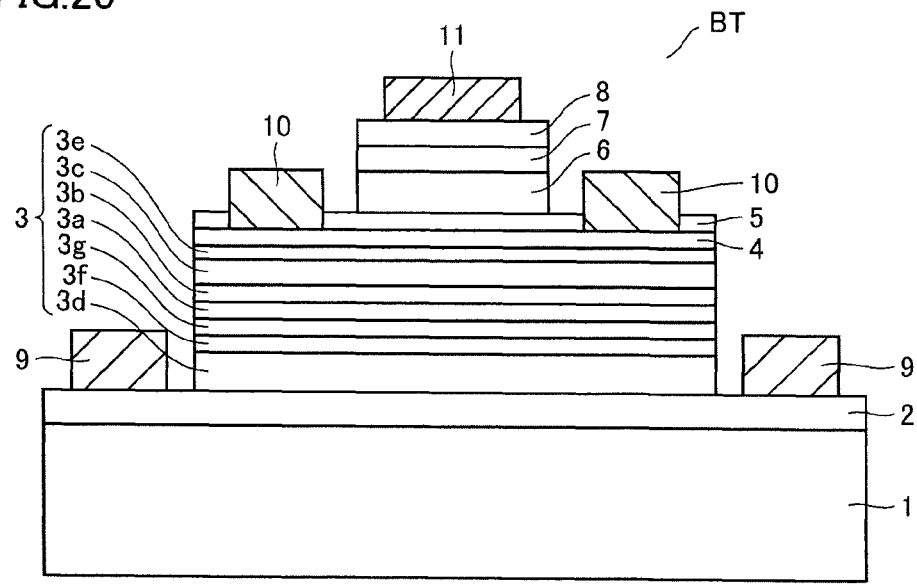
FIG. 20 is a cross-sectional view of a semiconductor device including a bipolar transistor according to a fourth embodiment of the present disclosure.
Figure 21:
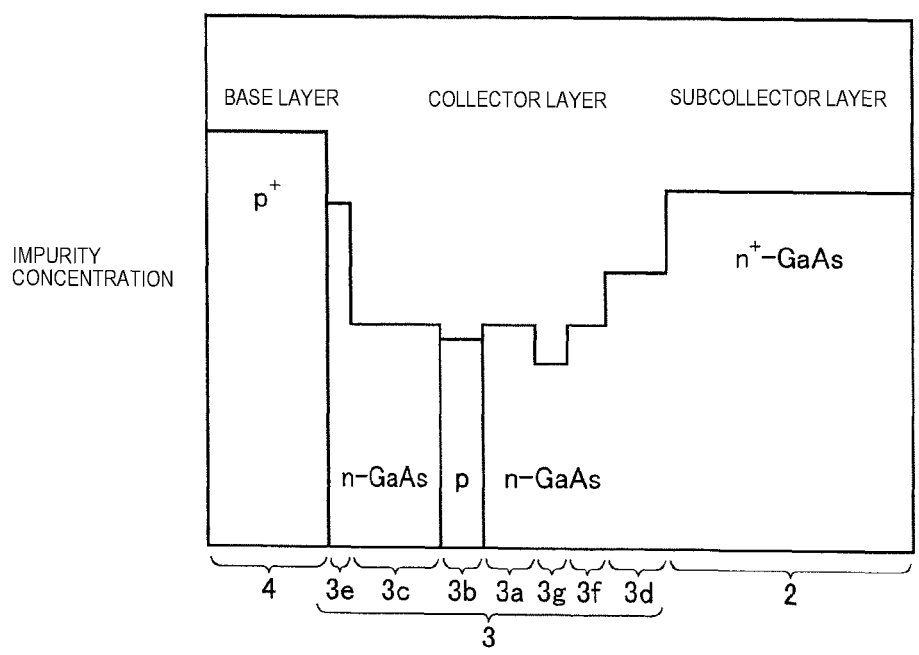
FIG. 21 is a figure depicting the distribution of the impurity concentration of a base layer, a collector layer, and a subcollector layer in the fourth embodiment.

As shown in FIG. 20 and FIG. 21, in this bipolar transistor, the collector layer 3 includes seven semiconductor layers: an n-type GaAs layer 3d (Si concentration: about $11 \times 10^{15}$ cm$^{-3}$, thickness: about 450 nm), an n-type GaAs layer 3f (Si concentration: about $5 \times 10^{15}$ cm$^{-3}$, thickness: about 20 nm), an n-type GaAs layer 3g (Si concentration: about $1 \times 10^{15}$ cm$^{-3}$, thickness: about 60 nm), an n-type GaAs layer 3a (Si concentration: about $5 \times 10^{15}$ cm$^{-3}$, thickness: about 20 nm), a p-type GaAs layer 3b (C concentration: about $4.5 \times 10^{15}$ cm$^{-3}$, thickness: about 100 nm, sheet concentration: $4.5 \times 10^{10}$ cm$^{-2}$), an n-type GaAs layer 3c (Si concentration: about $5 \times 10^{15}$ cm$^{-3}$, thickness: about 300 nm), and an n-type GaAs layer 3e (Si concentration: about $1 \times 10^{18}$ cm$^{-3}$, thickness: about 20 nm).

The sheet concentration of the p-type GaAs layer 3b is $4.5 \times 10^{18}$ cm$^{-2}$, which is set to less than $1 \times 10^{11}$ cm$^{-2}$. The n-type GaAs layer 3g is formed between the n-type GaAs layer 3f and the n-type GaAs layer 3a. The impurity concentration of the n-type GaAs layer 3g is set to be less than the impurity concentration of the n-type GaAs layer 3a and the n-type GaAs layer 3f. Since other members are the same as in the bipolar transistor shown in FIG. 17 or the like, the same members are denoted by the same reference numerals and description thereof is not repeated unless the description is necessary.

The bipolar transistor BT described above can be formed through substantially the same steps to those in the method for producing the bipolar transistor shown in FIG. 18 or the like by additionally forming the n-type GaAs layer 3g between the step of forming the n-type GaAs layer 3d that will serve as a collector layer and the step of forming the n-type GaAs layer 3a.

In the collector layer 3 of the bipolar transistor BT described above, the n-type GaAs layer 3g is formed between the n-type GaAs layer 3f and the n-type GaAs layer 3a. The impurity concentration of the n-type GaAs layer 3g is set to be less than the impurity concentration of the n-type GaAs layer 3a and the n-type GaAs layer 3f, and set to the lowest impurity concentration. Thus, the linearity of the base-to-collector capacitance Cbc can be further improved.

Figure 22:
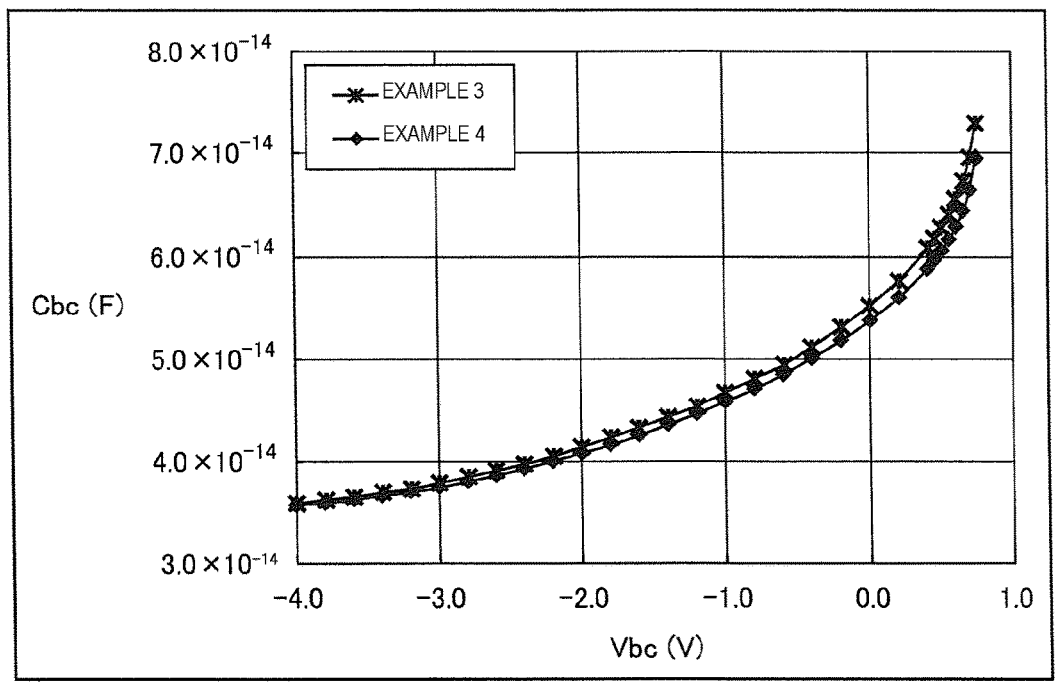
FIG. 22 is a graph depicting the relationship between the base-to-collector capacitance Cbc and the base-to-collector voltage Vbc for description of operational advantages in the fourth embodiment.

Since the n-type GaAs layer 3g having a low impurity concentration is formed, a depletion layer more easily extends in a positive voltage region of the base-to-collector voltage Vbc. Accordingly, as shown in FIG. 22, the base-to-collector capacitance Cbc of the bipolar transistor described above (Example 4) can be further reduced compared with the bipolar transistor (Example 3) described in the third embodiment.

The bipolar transistor described above accordingly can ensure the linearity of the base-to-collector capacitance Cbc, reduce modulation distortion, and reduce variations in collector voltage for power gain in a wide collector-to-emitter voltage Vce range from 0.8 V to 4 V (corresponding to Vbc=−2.65 V to 0.55 V) in both low-current operation and high-current operation, as described in the first embodiment and other embodiments.

The linearity of the base-to-collector capacitance Cbc can also be improved as long as the collector layer 3 of the bipolar transistor is a collector layer in which the n-type GaAs layer 3g with the lowest impurity concentration is disposed closer to the subcollector layer 2 than the p-type GaAs layer 3b and the impurity concentration is set to generally increase from the n-type GaAs layer 3g to the subcollector layer 2.

The phrase "the impurity concentration generally increases" means that the impurity concentration increases in a stepwise manner from the n-type GaAs layer 3g to the subcollector layer 2, or if the impurity concentration does not increase monotonously, the impurity concentration tends to generally increase from the n-type GaAs layer 3g to the subcollector layer 2. The same applies to the bipolar transistors including the n-type GaAs layer 3d described in the second and third embodiments.

Fifth Embodiment

As a semiconductor device according to a fifth embodiment, an exemplary semiconductor device including a heterojunction bipolar transistor including two p-layers (p-type semiconductor layers) in a collector layer is described.

Figure 23:
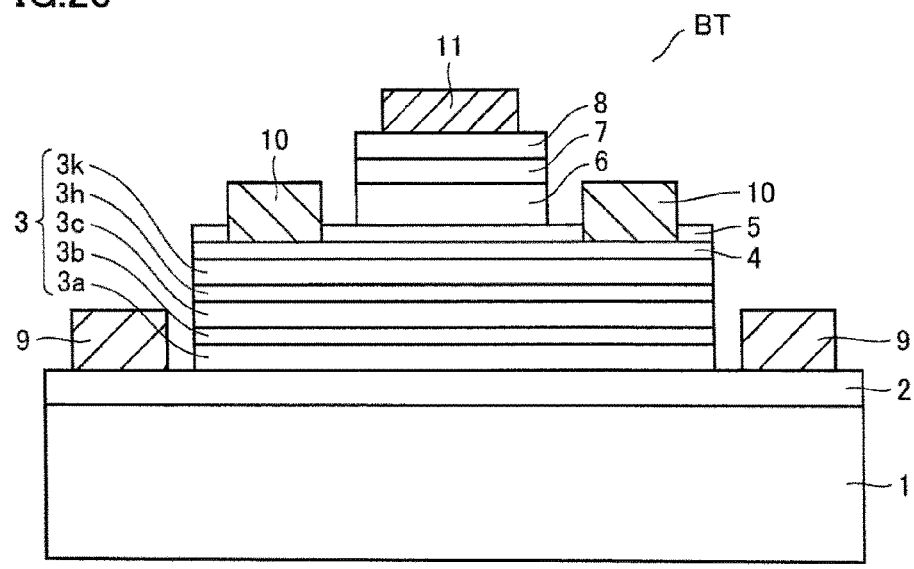
FIG. 23 is a cross-sectional view of a semiconductor device including a bipolar transistor according to a fifth embodiment of the present disclosure.

As shown in FIG. 23 and FIG. 24, in this bipolar transistor BT, the collector layer 3 includes five semiconductor layers: an n-type GaAs layer 3a (Si concentration: about $5 \times 10^{15}$ cm$^{-3}$, thickness: about 350 nm), a p-type GaAs layer 3b (C concentration: about $4.5 \times 10^{15}$ cm$^{-3}$, thickness: about 100 nm, sheet concentration: $4.5 \times 10^{10}$ cm$^{-2}$), an n-type GaAs layer 3c (Si concentration: about $5 \times 10^{15}$ cm$^{-3}$, thickness: about 200 nm), a p-type GaAs layer 3h (C concentration: about $4.5 \times 10^{15}$ cm$^{-3}$, thickness: about 100 nm, sheet concentration: $4.5 \times 10^{10}$ cm$^{-2}$), and an n-type GaAs layer 3k (Si concentration: about $5 \times 10^{15}$ cm$^{-3}$, thickness: about 200 nm).

In this collector layer 3, two p-layers (p-type semiconductor layers), namely, p-type GaAs layer 3b and the p-type GaAs layer 3h, are formed. The sheet concentration of the p-type GaAs layer 3b is $4.5 \times 10^{10}$ cm$^{-2}$, and the sheet concentration of the p-type GaAs layer 3h is also $4.5 \times 10^{10}$ cm$^{-2}$. The total sheet concentration of the p-type GaAs layer 3b and the p-type GaAs layer 3h in the collector layer 3 is set to about $9 \times 10^{10}$ cm$^{-2}$, which is less than $1 \times 10^{11}$ cm$^{-2}$. Since other members are the same as in the bipolar transistor shown in FIG. 1 or the like, the same members are denoted by the same reference numerals and description thereof is not repeated unless the description is necessary.

In the bipolar transistor BT described above, the collector layer 3 includes two p-layers, namely, the p-type GaAs layer 3b and the p-type GaAs layer 3h. The total sheet concentration of these p-layers is set to about $9 \times 10^{10}$ cm$^{-2}$, which is less than $1 \times 10^{11}$ cm$^{-2}$. The bipolar transistor BT described above thus can ensure the linearity of the base-to-collector capacitance Cbc, reduce modulation distortion, and reduce variations in collector voltage for power gain in a wide collector-to-emitter voltage Vce range from 0.8 V to 4 V (corresponding to Vbc=−2.65 V to 0.55 V) in both low-current operation and high-current operation in the same manner as in the bipolar transistor described in the first embodiment.

In the bipolar transistor BT described above, the case where the p-type GaAs layer 3b and the p-type GaAs layer 3h have the same thickness and the same impurity concentration (C concentration) is described. The p-type GaAs layer 3b and the p-type GaAs layer 3h may be designed to have a different thickness or may be designed to have a different impurity concentration as long as the total sheet concentration is less than $1\times10^{11}$ cm$^{-2}$.

The linearity of the base-to-collector capacitance Cbc can also be improved by forming at least one of two p-layers, namely, the p-type GaAs layer 3b and the p-type GaAs layer 3h, in such a manner that the p-layer start position is in the range where the distance from the base layer end corresponds to 10% to 70% of the thickness of the collector layer as in the description of the first embodiment.

The base-to-collector capacitance Cbc in low-current operation and the base-to-collector capacitance Cbc in high-current operation can be made substantially the same and the linearity of the base-to-collector capacitance Cbc can be improved by setting the impurity concentration of the p-type GaAs layer 3b and the p-type GaAs layer 3h to be less than the impurity concentration of the n-type GaAs layer 3a, the n-type GaAs layer 3c, and the n-type GaAs layer 3k.

Figure 26:
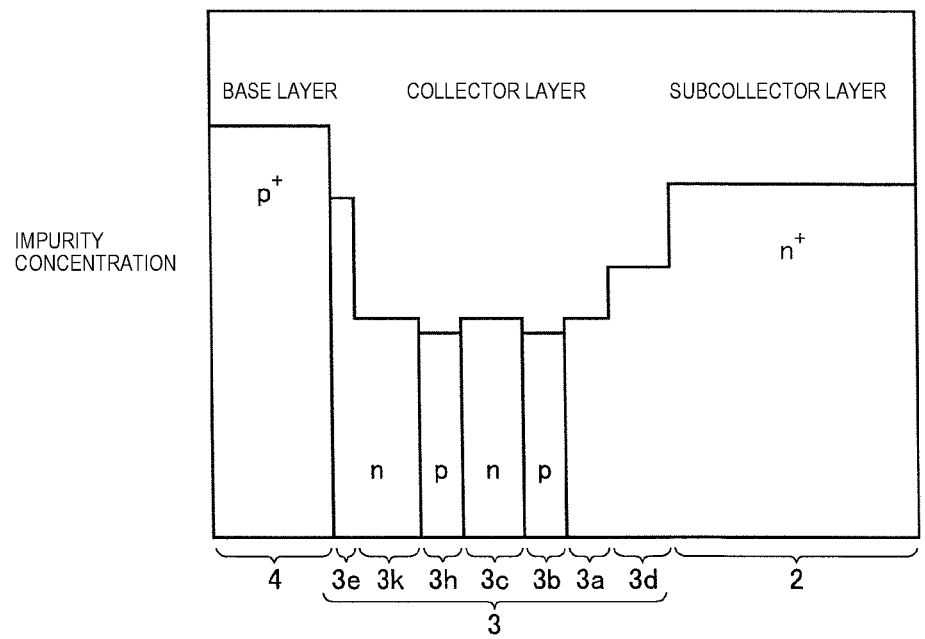
FIG. 26 is a figure depicting the distribution of the impurity concentration of a base layer, a collector layer, and a subcollector layer of a bipolar transistor according to a second modification in the fifth embodiment.
Figure 27:
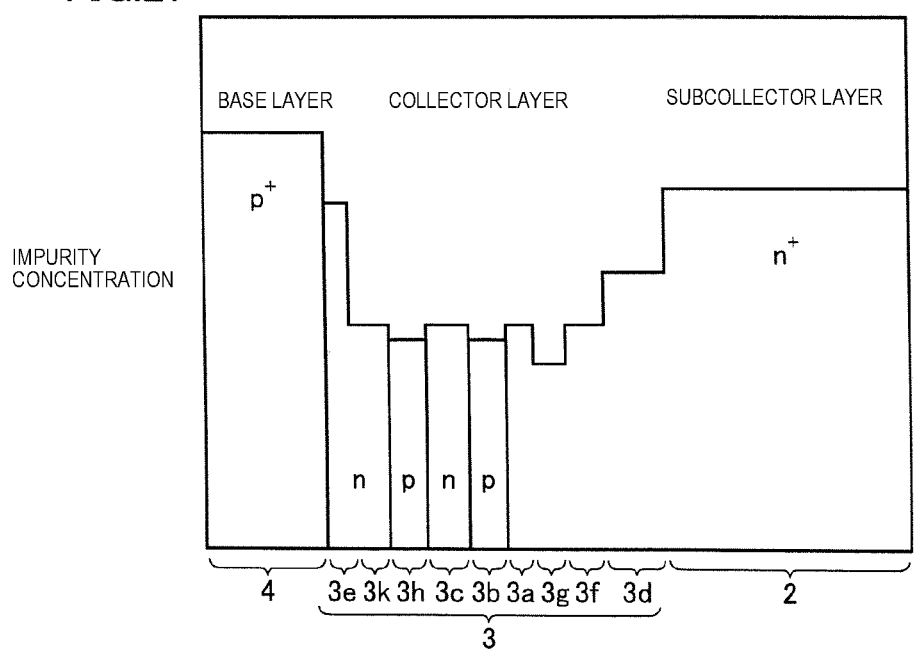
FIG. 27 is a figure depicting the distribution of the impurity concentration of a base layer, a collector layer, and a subcollector layer of a bipolar transistor according to a third modification in the fifth embodiment.

As shown in FIG. 25, as in the description of the second embodiment, the n-type GaAs layer 3d may be disposed between the n-type GaAs layer 3a and the subcollector layer 2. The n-type GaAs layer 3d has an impurity concentration more than the impurity concentration of the n-type GaAs layer 3a and less than the impurity concentration of the subcollector layer 2. As in the description of the third embodiment, the n-type GaAs layer 3e having an impurity concentration more than the impurity concentration of the n-type GaAs layer 3k may be disposed in contact with the base layer 4 as shown in FIG. 26. As in the description of the fourth embodiment, the n-type GaAs layer 3g having an impurity concentration less than the impurity concentration of the n-type GaAs layer 3a and the n-type GaAs layer 3f may be disposed as shown in FIG. 27.

Sixth Embodiment

As a semiconductor device according to a sixth embodiment, a semiconductor device including a heterojunction bipolar transistor including three p-layers (p-type semiconductor layers) in a collector layer is described.

Figure 28:
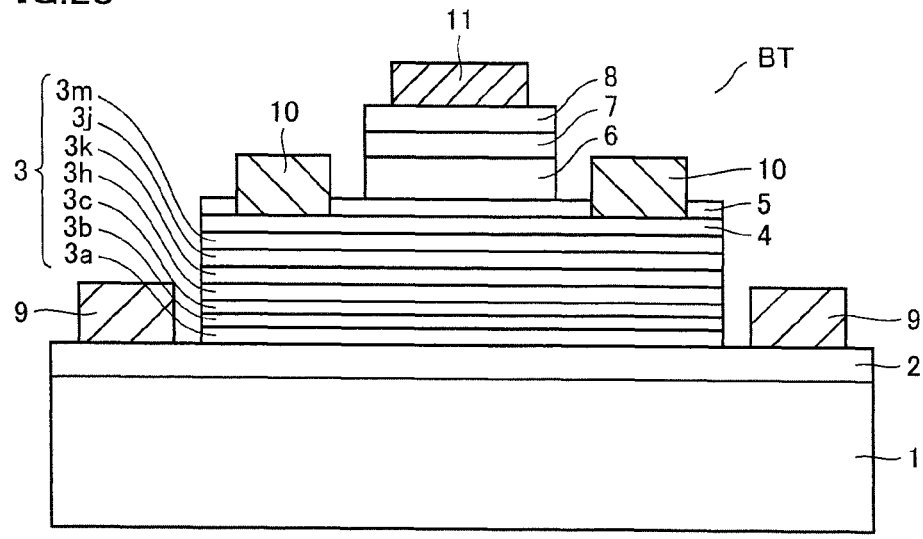
FIG. 28 is a cross-sectional view of a semiconductor device including a bipolar transistor according to a sixth embodiment of the present disclosure.
Figure 29:
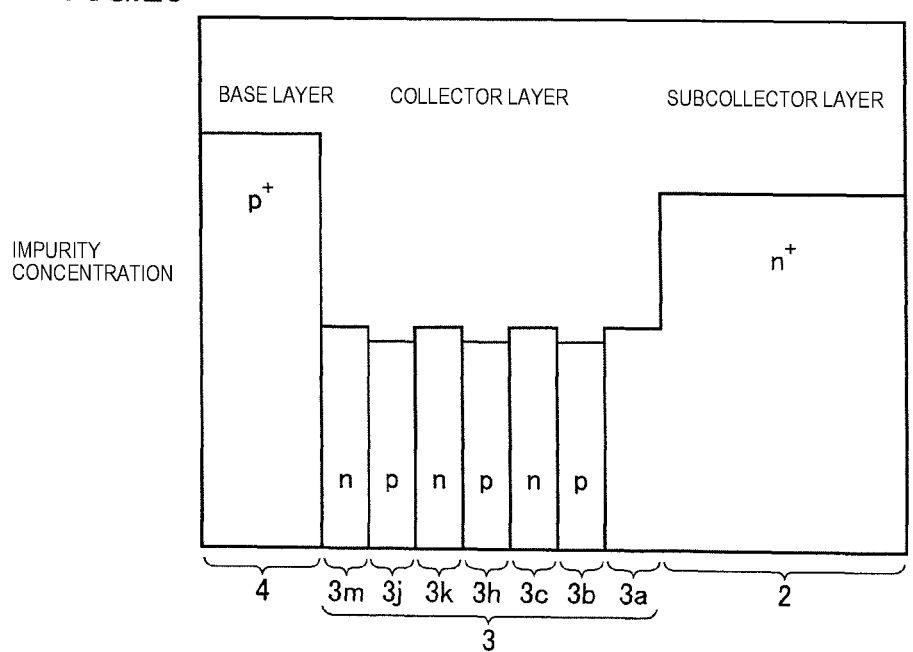
FIG. 29 is a figure depicting the distribution of the impurity concentration of a base layer, a collector layer, and a subcollector layer in the sixth embodiment.
Figure 30:
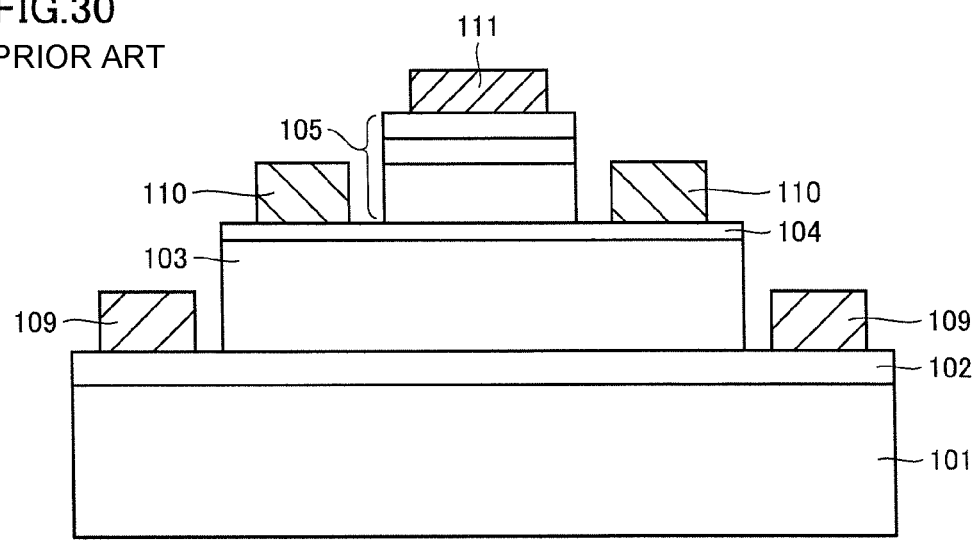
FIG. 30 is a cross-sectional view of a semiconductor device including a bipolar transistor according to a first example of the prior art.
Figure 31:
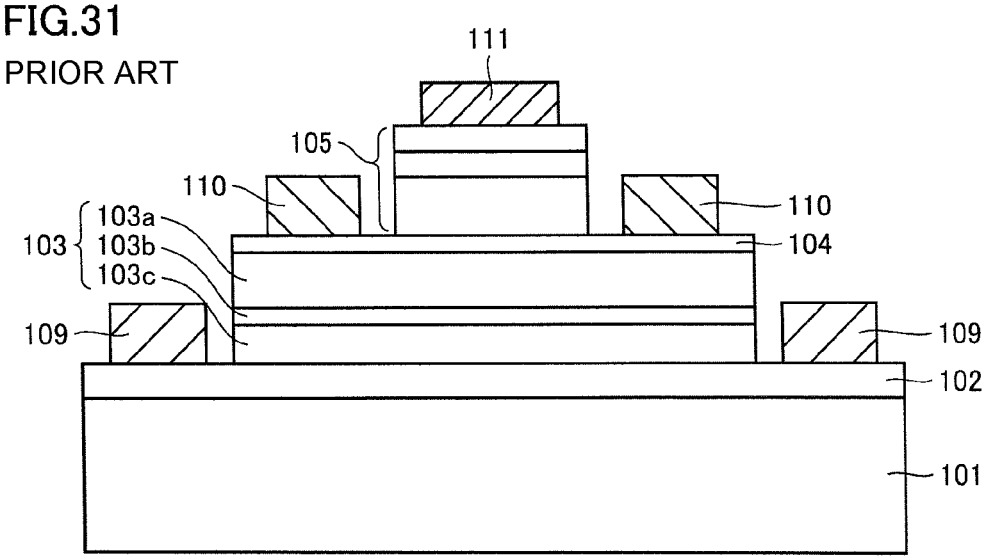
FIG. 31 is a cross-sectional view of a semiconductor device including a bipolar transistor according to a second example of the prior art.
Figure 32:
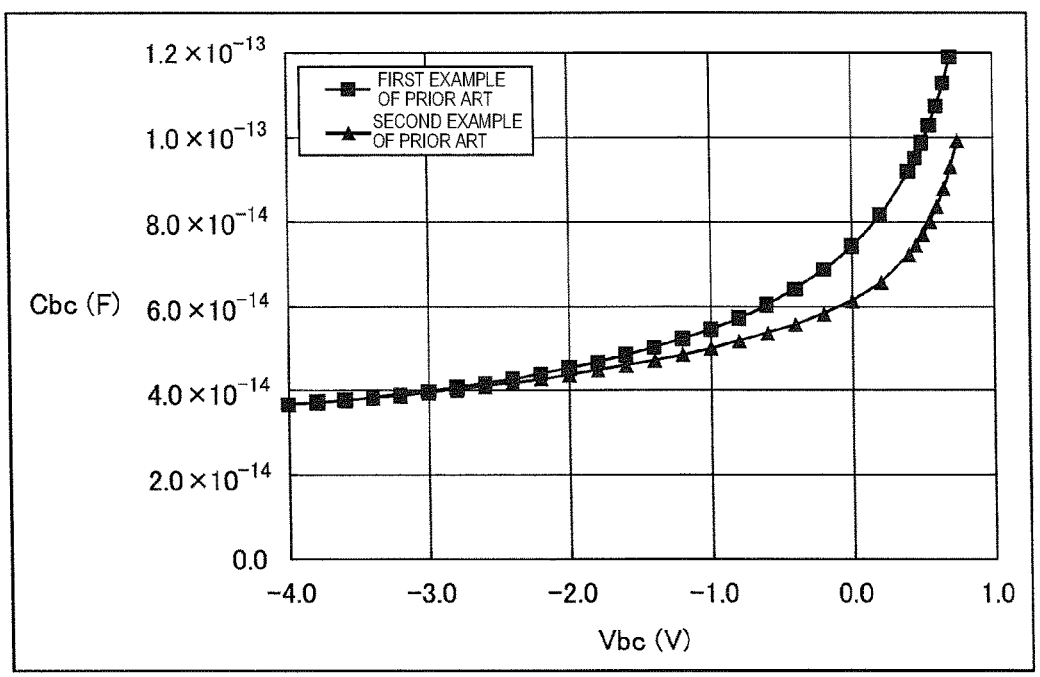
FIG. 32 is a graph depicting the relationship between the base-to-collector capacitance Cbc and the base-to-collector voltage Vbc in a bipolar transistor according to an example of the prior art.

As shown in FIG. 28 and FIG. 29, in this bipolar transistor BT, the collector layer 3 includes seven semiconductor layers: an n-type GaAs layer 3a (Si concentration: about $5\times10^{15}$ cm$^{-3}$, thickness: about 350 nm), a p-type GaAs layer 3b (C concentration: about $3\times10^{15}$ cm$^{-3}$, thickness: about 100 nm, sheet concentration: $3\times10^{10}$ cm$^{-2}$), an n-type GaAs layer 3c (Si concentration: about $5\times10^{15}$ cm$^{-3}$, thickness: about 200 nm), a p-type GaAs layer 3h (C concentration: about $3\times10^{15}$ cm$^{-3}$, thickness: about 100 nm, sheet concentration: $3\times10^{10}$ cm$^{-2}$), an n-type GaAs layer 3k (Si concentration: about $5\times10^{15}$ cm$^{-3}$, thickness: about 200 nm), a p-type GaAs layer 3j (C concentration: about $3\times10^{15}$ cm$^{-3}$, thickness: about 100 nm, sheet concentration: $3\times10^{10}$ cm$^{-2}$), and an n-type GaAs layer 3m (Si concentration: about $5\times10^{15}$ cm$^{-3}$, thickness: about 200 nm).

In this collector layer 3, three p-layers (p-type semiconductor layers), namely, the p-type GaAs layer 3b, the p-type GaAs layer 3h, and the p-type GaAs layer 3j, are formed. The sheet concentration of the p-type GaAs layer 3b, the p-type GaAs layer 3h, and the p-type GaAs layer 3j is $3\times10^{10}$ cm$^{-2}$. The total sheet concentration of the p-type GaAs layer 3b, the p-type GaAs layer 3h, and the p-type GaAs layer 3j in the collector layer 3 is set to about $9\times10^{10}$ cm$^{-2}$, which is less than $1\times10^{11}$ cm$^{-2}$.

In the bipolar transistor described above, the collector layer 3 includes three p-layers, namely, the p-type GaAs layer 3b, the p-type GaAs layer 3h, and the p-type GaAs layer 3j. The total sheet concentration of these p-layers is set to about $9\times10^{10}$ cm$^{-2}$, which is less than $1\times10^{11}$ cm$^{-2}$. The bipolar transistor described above thus can obtain the linearity of the base-to-collector capacitance Cbc and have reduced modulation distortion and reduced variations in collector voltage for power gain in a wide collector-to-emitter voltage Vce range from 0.8 V to 4 V (corresponding to Vbc=−2.65 V to 0.55 V) in both low-current operation and high-current operation in the same manner as in the bipolar transistor described in the first embodiment.

In the bipolar transistor described above, the case where the p-type GaAs layer 3b, the p-type GaAs 3h, and the p-type GaAs layer 3j have the same thickness and the same impurity concentration (C concentration) is described. The p-type GaAs layer 3b, the p-type GaAs 3h, and the p-type GaAs layer 3j may be designed to have a different thickness or may be designed to have a different impurity concentration as long as the total sheet concentration is less than $1\times10^{11}$ cm$^{-2}$.

The linearity of the base-to-collector capacitance Cbc can also be improved by forming at least one of three p-layers, namely, the p-type GaAs layer 3b, the p-type GaAs 3h, and the p-type GaAs layer 3j, in such a manner that the p-layer start position is in the range where the distance from the base layer end corresponds to 10% to 70% of the thickness of the collector layer as in the description of the first embodiment.

The base-to-collector capacitance Cbc in low-current operation and the base-to-collector capacitance Cbc in high-current operation can be made substantially the same and the linearity of the base-to-collector capacitance Cbc can be improved by setting the impurity concentration of the p-type GaAs layer 3b, the p-type GaAs 3h, and the p-type GaAs layer 3j to be less than the impurity concentration of the n-type GaAs layer 3a, the n-type GaAs layer 3c, the n-type GaAs layer 3k, and the n-type GaAs layer 3m.

An n-type GaAs layer 3d may be disposed in the same manner as shown in FIG. 25. An n-type GaAs layer 3e may be further disposed in the same manner as shown in FIG. 26. An n-type GaAs layer 3g may also be disposed in the same manner as shown in FIG. 27.

In the bipolar transistors according to the embodiments described above, the cases where the emitter layer 5 is formed of an InGaP layer and the base layer 4 is formed of a GaAs layer are described as examples. The combination of materials of the emitter layer and the base layer (emitter layer/base layer) is not limited to InGaP layer/GaAs layer. Examples of materials used for the heterojunction bipolar transistor include AlGaAs layer/GaAs layer, InP layer/InGaAs layer, InGaP layer/GaAsSb layer, InGaP layer/InGaAsN-layer, Si layer/SiGe layer, and AlGaN-layer/GaN-layer.

The bipolar transistor is not limited to a heterojunction type and the configuration of the collector layer described above can be widely applied to bipolar transistors.

The embodiments disclosed herein are illustrative only and not construed as limitations. The present disclosure is described not by the above-mentioned range but by the claims, and intended to include all modifications in the meaning and scope of the claims and equivalents thereof.

INDUSTRIAL APPLICABILITY

The present disclosure is effectively used in semiconductor devices including bipolar transistors.

The invention claimed is:

1. A semiconductor device comprising:
a collector layer,
a base layer formed on the collector layer, and
an emitter layer formed on the base layer,
wherein
the collector layer includes:
first-conductivity-type semiconductor layers, and
at least one second-conductivity-type semiconductor layer,
the first-conductivity-type semiconductor layers and the second-conductivity-type semiconductor layer are of opposite conductivity type, and
the second-conductivity-type semiconductor layer has a total sheet concentration set to less than $1 \times 10^{11}$ cm$^{-2}$.

2. The semiconductor device according to claim 1, wherein
the second-conductivity-type semiconductor layer is sandwiched between the first-conductivity-type semiconductor layers, and
the second-conductivity-type semiconductor layer is disposed in such a manner that a distance between an end surface of the collector layer, the end surface contacting the base layer, and one junction interface selected from junction interfaces between the second-conductivity-type semiconductor layer and the first-conductivity-type semiconductor layers, the one junction interface being located on a base layer side, is in a distance range corresponding to 10% to 70% of a thickness of the collector layer.

3. The semiconductor device according to claim 2, wherein
the second-conductivity-type semiconductor layer is disposed in such a manner that the distance between the end surface and the junction interface located on a base layer side is in a distance range corresponding to 30% to 60% of the thickness of the collector layer.

4. The semiconductor device according to claim 1, wherein
the second-conductivity-type semiconductor layer is disposed between the first-conductivity-type semiconductor layers, and
an impurity concentration of the second-conductivity-type semiconductor layer is set to be less than that of a portion of each first-conductivity-type semiconductor layer, the portion contacting the second-conductivity-type semiconductor layer.

5. The semiconductor device according to claim 4, wherein
a subcollector layer is formed between a semiconductor substrate and the collector layer, and
the impurity concentration of the first-conductivity-type semiconductor layers is set to have a tendency to increase from a second-conductivity-type semiconductor layer side to a subcollector layer side.

6. The semiconductor device according to claim 1, wherein
the first-conductivity-type semiconductor layers include:
an impurity concentration layer doped with an impurity,
a first high-concentration layer having an impurity concentration more than an impurity concentration of the impurity concentration layer,
a subcollector layer is formed between a semiconductor substrate and the collector layer, and
the first high-concentration layer is formed on a subcollector layer side, and the impurity concentration layer is formed on a base layer side.

7. The semiconductor device according to claim 6, wherein
the second-conductivity-type semiconductor layer is disposed between the impurity concentration layer and the first high-concentration layer.

8. The semiconductor device according to claim 6, wherein
the first-conductivity-type semiconductor layers include a low-concentration layer having an impurity concentration less than the impurity concentration of the impurity concentration layer, and
the low-concentration layer is disposed between the second-conductivity-type semiconductor layer and the first high-concentration layer.

9. The semiconductor device according to claim 6, wherein
the first-conductivity-type semiconductor layers include a second high-concentration layer having an impurity concentration more than the impurity concentration of the impurity concentration layer, and
the second high-concentration layer is disposed in contact with the base layer.

10. The semiconductor device according to claim 1, wherein
the first-conductivity-type semiconductor layers and the second-conductivity-type semiconductor layer are formed of the same semiconductor.

11. The semiconductor device according to claim 1, wherein
the emitter layer and the base layer form a heterojunction, and
the emitter layer has a band gap set to be larger than a band gap of the base layer.

12. The semiconductor device according to claim 1, wherein
the emitter layer is of the first-conductivity-type and the base layer is of the second-conductivity-type.

13. The semiconductor device according to claim 1, wherein
the at least one second-conductivity-type semiconductor layer is a single second-conductivity-type semiconductor layer.

14. The semiconductor device according to claim 13, wherein
the first-conductivity-type semiconductor layers include:
an impurity concentration layer doped with an impurity,
a first high-concentration layer having an impurity concentration more than an impurity concentration of the impurity concentration layer,
a subcollector layer is formed between a semiconductor substrate and the collector layer, and
the first high-concentration layer is formed on a subcollector layer side, and the impurity concentration layer is formed on a base layer side.

15. The semiconductor device according to claim 14, wherein
the second-conductivity-type semiconductor layer is disposed between the impurity concentration layer and the first high-concentration layer.

16. The semiconductor device according to claim 14, wherein
the first-conductivity-type semiconductor layers include a low-concentration layer having an impurity concentration less than the impurity concentration of the impurity concentration layer, and
the low-concentration layer is disposed between the second-conductivity-type semiconductor layer and the first high-concentration layer.

17. The semiconductor device according to claim 14, wherein
the first-conductivity-type semiconductor layers include a second high-concentration layer having an impurity concentration more than the impurity concentration of the impurity concentration layer, and
the second high-concentration layer is disposed in contact with the base layer.

18. The semiconductor device according to claim 13, wherein
the second-conductivity-type semiconductor layer is disposed between the first-conductivity-type semiconductor layers, and
an impurity concentration of the second-conductivity-type semiconductor layer is set to be less than that of a portion of each first-conductivity-type semiconductor layer, the portion contacting the second-conductivity-type semiconductor layer.

19. The semiconductor device according to claim 13, wherein
a subcollector layer is formed between a semiconductor substrate and the collector layer, and
the impurity concentration of the first-conductivity-type semiconductor layers is set to have a tendency to increase from a second-conductivity-type semiconductor layer side to a subcollector layer side.

20. The semiconductor device according to claim 13, wherein
the second-conductivity-type semiconductor layer is sandwiched between the first-conductivity-type semiconductor layers, and
the second-conductivity-type semiconductor layer is disposed in such a manner that a distance between an end surface of the collector layer, the end surface contacting the base layer, and one junction interface selected from junction interfaces between the second-conductivity-type semiconductor layer and the first-conductivity-type semiconductor layers, the one junction interface being located on a base layer side, is in a distance range corresponding to 10% to 70% of a thickness of the collector layer.

\* \* \* \* \*